(12) United States Patent
Bhadra et al.

(10) Patent No.: US 8,050,904 B2
(45) Date of Patent: Nov. 1, 2011

(54) SYSTEM AND METHOD FOR CIRCUIT SYMBOLIC TIMING ANALYSIS OF CIRCUIT DESIGNS

(75) Inventors: Jayanta Bhadra, Austin, TX (US); Magdy S. Abadir, Austin, TX (US); Ping Gao, Wynn Vale (AU); Timothy David McDougall, Tranmere North (AU)

(73) Assignee: Freescale Semiconductor, Inc., Austin, TX (US)

( * ) Notice: Subject to any disclaimer, the term of this patent is extended or adjusted under 35 U.S.C. 154(b) by 1265 days.

(21) Appl. No.: 11/532,268

(22) Filed: Sep. 15, 2006

(65) Prior Publication Data
US 2008/0071515 A1    Mar. 20, 2008

(51) Int. Cl.
*G06F 17/50* (2006.01)
(52) U.S. Cl. ............... 703/16; 703/14; 703/15; 716/108
(58) Field of Classification Search .............. 703/13–17, 703/19; 716/6, 108
See application file for complete search history.

(56) References Cited

U.S. PATENT DOCUMENTS

| | | | | |
|---|---|---|---|---|
| 5,384,720 A * | 1/1995 | Ku et al. | ........................... | 703/16 |
| 5,657,239 A * | 8/1997 | Grodstein et al. | ................. | 716/6 |
| 5,933,356 A * | 8/1999 | Rostoker et al. | ................. | 703/15 |
| 6,470,482 B1 * | 10/2002 | Rostoker et al. | ................... | 716/6 |
| 6,553,550 B1 * | 4/2003 | Menegay et al. | ................. | 716/6 |
| 7,219,048 B1 * | 5/2007 | Xu | ................................... | 703/19 |
| 7,512,918 B2 * | 3/2009 | Andreev et al. | .................... | 716/6 |
| 7,555,689 B2 * | 6/2009 | Goswami et al. | ............. | 714/741 |

OTHER PUBLICATIONS

Harbort et al. "Karnaugh Maps", Jan. 2001, 7 pages.*

* cited by examiner

*Primary Examiner* — Kamini S Shah
*Assistant Examiner* — Suzanne Lo
(74) *Attorney, Agent, or Firm* — VanLeeuwen & VanLeeuwen; David Dolezal

(57) ABSTRACT

A method, data processing system, and computer program product are provided for performing time-based symbolic simulation. A delay-aware representation of a circuit is created that includes a plurality of circuit nodes. The data-aware representation is simulated. In particular, the simulator simulates transitions from a first set of circuit nodes to a second set of circuit nodes selected from the plurality of circuit nodes, the simulating based on executing a first set of simulation events. A second set of simulation events is then generated in response to executing the first set of simulation events. During the simulation, a time is computed for each of the transitions. An an event scheduling diagram is constructed during simulation. The event scheduling diagram depicts the transitions and the times of the transitions.

20 Claims, 15 Drawing Sheets

1200

| Analysis 1210 | Analysis Predicate 1220 | Termination ESD Node for ESD exploration 1230 | Exploration Required 1240 |
|---|---|---|---|
| Identification of critical path and generating sensitizing input vectors | sim_stable? | ESD nodes with the longest time stamp and not marked by the false-path flag | Yes |
| Identification of false path | sim_stable? | ESD nodes marked by the false-path flag | Yes |
| Checking a reported critical path | sim_done | ESD nodes match the end nodes of the reported critical path | Yes |
| Identification of nodes that can simultaneously switch, or switch within some finite amount of time | TRUE | ESD nodes that have specified circuit nodes simultaneously switched | No |
| Identification of minimum and maximum arrival times along a path | TRUE | ESD nodes with shortest or longest time stamps | No |
| Identification of conditions to trigger a maximum number of event transitions | sim_done | ESD nodes at which maximal number of events can be scheduled | No |

*Fig. 12*

SYSTEM AND METHOD FOR CIRCUIT SYMBOLIC TIMING ANALYSIS OF CIRCUIT DESIGNS

FIELD OF THE INVENTION

The present invention relates generally to a system and method for performing timing analysis on digital circuits. More particularly, the present invention relates to a system and method for achieving timing analysis through symbolic simulation in presence of delays.

RELATED ART

Custom circuits are created in a variety of ways. Circuits can be created using a circuit generator that uses pre-defined logic blocks and connects the logic blocks. Circuits can also be designed by skilled circuit designers. Models representing the circuit being designed are stored in a variety of formats depending on the circuit design tools being used. Examples of design model formats include Verilog and VHDL. After being designed, custom circuits are often optimized by skilled circuit designers by manipulating a graphical representation of the design using various design tools. Sometimes manual optimization is performed in order for the design to meet stringent design goals. After a circuit is designed, it is usually simulated using a variety of simulation tools in order to identify various errors, or bugs, in the circuit design. One type of analysis that is performed is a timing analysis.

One approach to performing timing analysis is a static timing analysis approach. The static timing approach generally analyzes the circuit's structure and adds up the signal delays that occur at the various circuit components. A challenge with the static timing approach is that it does not dynamically analyze the way that the circuit actually behaves. This can result in false vector generation. Namely, false vector generation is the simulation of vectors that cannot exist given the structure of the circuit. Also, because the static timing approach does not take the circuit's behavior into account, it is often too pessimistic in calculating timing results. This is especially true when a custom circuit's structures vary from standard circuit structures.

Another approach to performing timing analysis is a dynamic timing approach. In contrast to the static approach, the dynamic approach takes into account the actual behavior of the circuit. The challenge with this approach, however, is that dynamic analysis attempts to simulate each path through the circuit. In a simple circuit with three inputs, the number of simulations needed to simulate each path is at least eight ($2^3$). A circuit of even medium complexity can have many input combinations resulting in an exponentially high number of possible paths. The high number of resulting possible paths can therefore render the dynamic timing approach cost prohibitive in terms of time and cost needed to fully simulate the design.

BRIEF DESCRIPTION OF THE DRAWINGS

The present invention may be better understood, and its numerous objects, features, and advantages made apparent to those skilled in the art by referencing the accompanying drawings, wherein:

FIG. 12 is a diagram showing the predicates for the various analyses of the event scheduling diagram;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
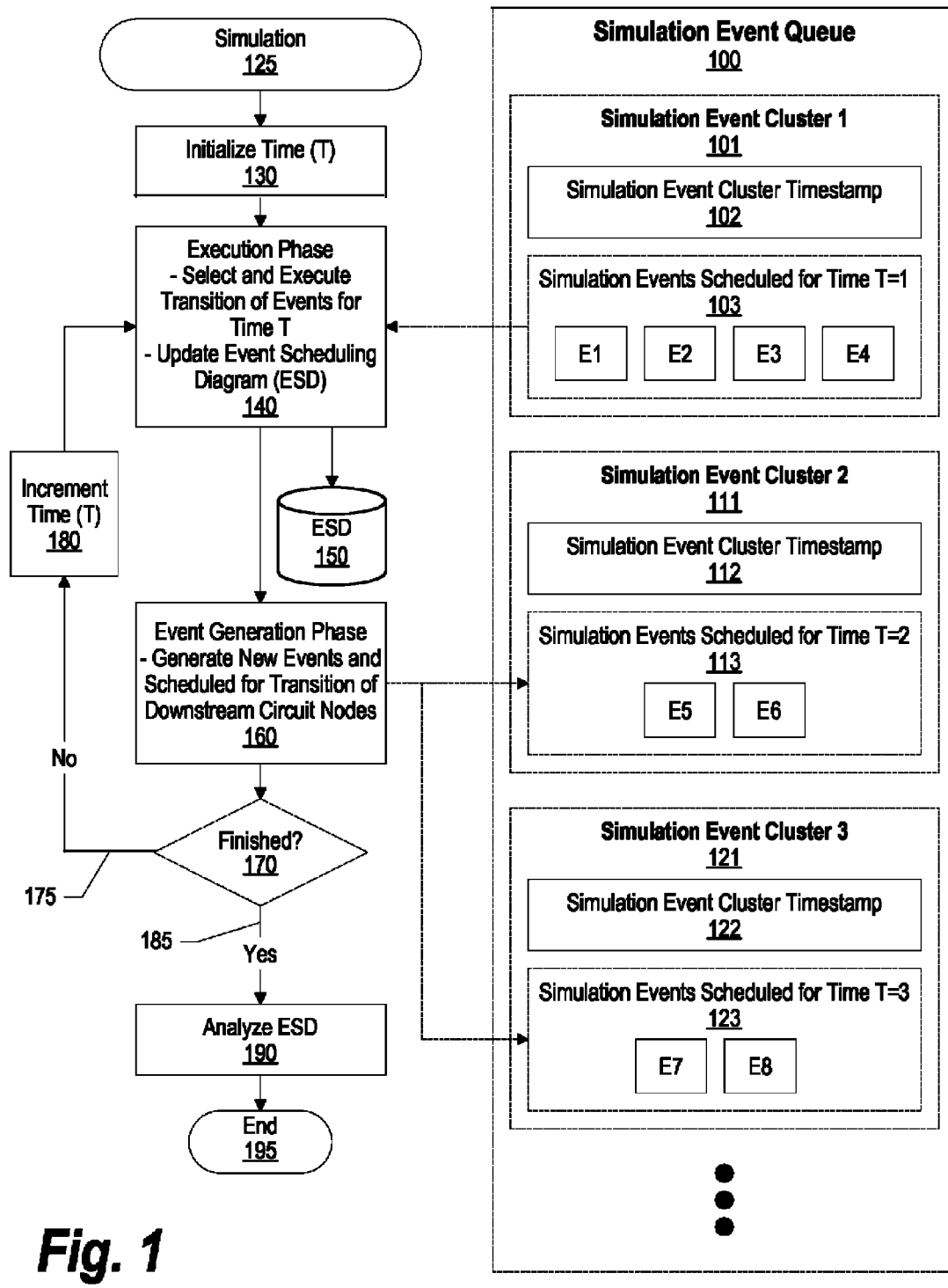
FIG. 1 is a high-level flowchart showing an overview of steps taken during a time-based simulation of events stored in a simulation event queue.

FIG. 1 is a high-level flowchart showing an overview of steps taken during a time-based simulation of events stored in a simulation event queue. Simulation event queue 100 stores simulation events. In the example shown, the simulation events scheduled for simulation are E1 through E8. The simulation events stored in simulation event queue 100 are grouped into simulation event clusters. In the example shown in FIG. 1, simulation event queue 100 includes three simulation event clusters (simulation event cluster 101, 111, and 121). Each simulation event cluster includes a simulation event cluster timestamp (simulation event cluster timestamps 102, 112, and 122 corresponding to simulation event clusters 101, 111, and 121, respectively. Each simulation event cluster also include one or more simulation events scheduled for the given timestamp. In the example shown, simulation event cluster 101 includes simulation events E1 through E4, simulation event cluster 111 includes simulation events E5 and E6, and simulation event cluster 121 includes simulation events E7 and E8. In the example shown, the simulation events included in the first simulation event cluster (101) are executed when the timestamp is equal to "1" (representing a first time cycle being simulated), the simulation events included in the second simulation event cluster (111) are executed when the timestamp is equal to "2" (representing a second time cycle being simulated), and the simulation events included in the third simulation event cluster (121) are executed when the timestamp is equal to "3" (representing a third time cycle being simulated).

Simulation processing is shown commencing at 125 whereupon, at step 130, a simulated timer is initialized (e.g., to "1" representing the first time cycle being simulated). At step 140, the symbolic simulator performs an execution phase. During the execution phase, simulation events scheduled for the given time (as indicted by the simulated timer) are selected and executed resulting in transition of the simulation events. In addition, during the execution phase, the event scheduling diagram is updated to reflect the resulting transitions that resulted from executing the simulation events. Using example simulation event queue 100, when the simulated timer is initialized to "1", the symbolic simulator reads the simulation event clusters' timestamps and selects the simulation event cluster with a timestamp equal to "1" (simulation event cluster 101). The simulation events included in the selected simulation event cluster are then executed (in this case simulation events E1 through E4 are executed). The results of executing the simulation events in the first simulation event cluster are reflected in event scheduling diagram 150.

At step 160, the symbolic simulator performs an event generation phase where new simulation events are generated and simulation events are scheduled for transition of downstream nodes. In other words, the execution of simulation events E1 to E4 (corresponding to initial nodes in the circuit being simulated), results in other downstream nodes being scheduled. Simulation events corresponding to these downstream nodes are generated and scheduled. If a downstream node is scheduled for a future time that does not yet have a corresponding simulation event cluster, the simulation event cluster is created and the newly created simulation event cluster's timestamp is updated with the future time.

A determination is made as to whether simulation is finished (decision 170). If simulation is not finished, decision 170 branches to "no" branch 175 whereupon, at step 180, the simulated timer is incremented (e.g., to the next time cycle that is being simulated), and processing loops back to perform the execution phase and event generation phase for the new time cycle. Note that the simulated timer may be incremented by more than one time unit (e.g., clock cycle), because timestamps with no scheduled events are skipped. This looping continues until simulation is finished, at which point decision 170 branches to "yes" branch 185 whereupon, at step 190, the event scheduling diagram is analyzed and processing ends at 195. Based on the event scheduling diagram, the user can alter the circuit design and re-simulate the altered design using steps 125 to 190.

Figure 2:
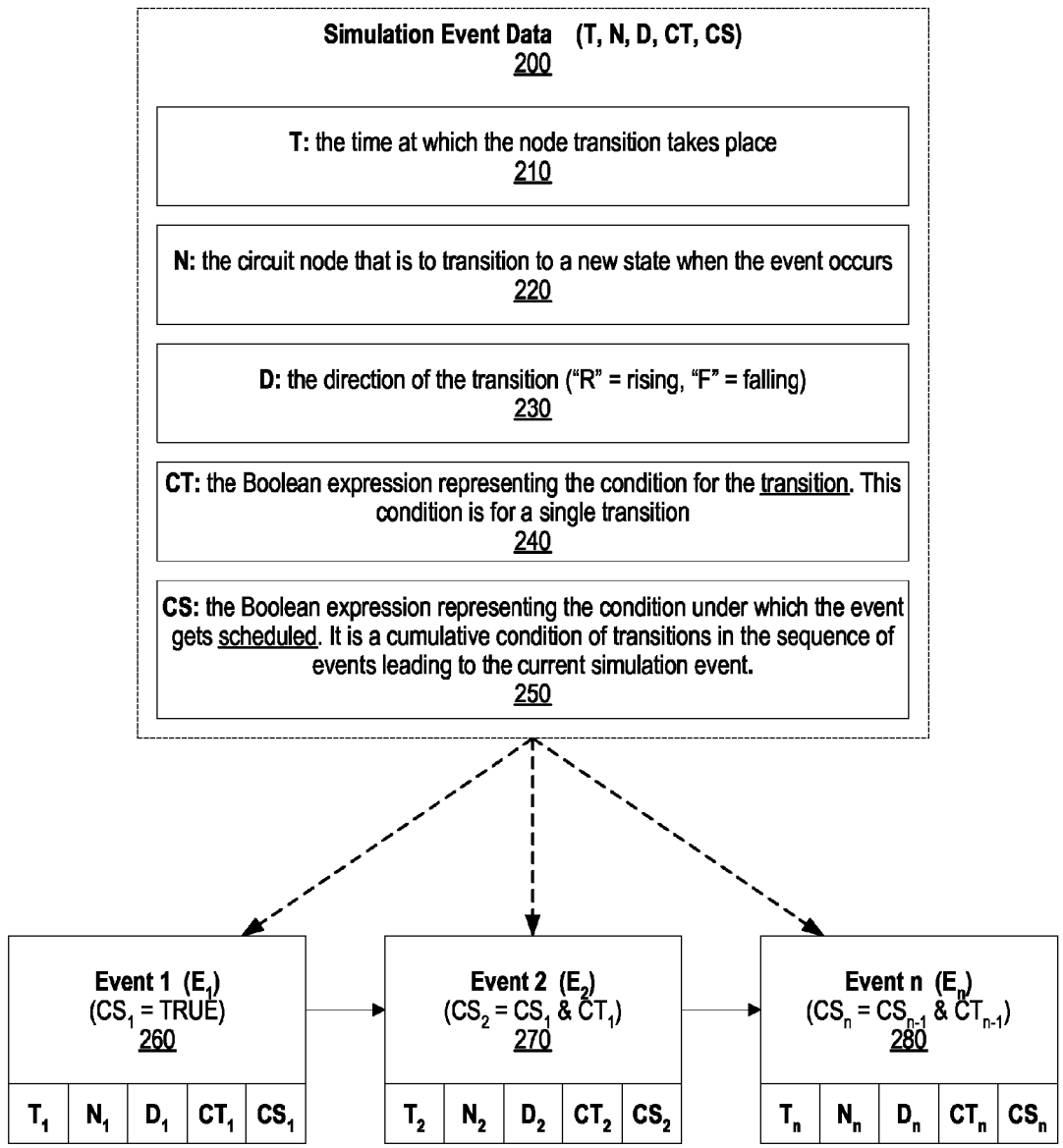
FIG. 2 is a data diagram showing the data maintained for simulation events.

FIG. 2 is a data diagram showing the data maintained for simulation events. Simulation event data 200 is a data structure used to store simulation event data. Using the example shown in FIG. 1, each of the simulation events (E1 through E8) would have simulation event data as shown in FIG. 2. The simulation event data includes five fields. (T) represents time (210) which is the time at which the node transition takes place. This time is used to group the simulation event in the correct simulation event cluster. Using the example shown in FIG. 1, if a node transition takes place during the third time cycle (T=3), then the simulation event would be stored with simulation event cluster 121. (N) represents node (220) which corresponds to a circuit node in the circuit design that is to transition to a new state when the simulation event occurs.

(D) represents direction (230) of the transition. In one embodiment, two transitions are represented—an "R" (for "rising," or "pull up") corresponding to the node rising (e.g., being turned on, being set to true, being pulled up, etc.), and an "F" (for "falling," or "pull down") corresponding to the node falling (e.g., being turned off, being set to false, being pulled down, etc.). In other words, for a given node there may be two simulation events—one corresponding to conditions that occur if the node is "pulled up" and another corresponding to conditions that occur if the node is "pulled down."

(CT) represents the condition for this transition (240). The condition for the transition is a Boolean expression for a single transition, such as the node being pulled up. (CS) represents the condition under which the simulation event is scheduled (250). The condition under which the simulation event is scheduled is a cumulative condition of transitions in the sequence of simulation events leading up to this simulation event.

Three example simulation events (simulation events 260, 270, and 280) are shown at the bottom of FIG. 2. The first simulation event (260) is shown with a scheduled condition (CS) being TRUE and the transition condition (CT) is defined by the symbolic vector applied to the input. This would be an example of an initial node that would be executed at a first time cycle. The next simulation event (270) is shown with a scheduled condition (CS) that is cumulative (the first simulation event's CS and the first simulation event's transition condition (CT)).

In other words, the second simulation event (270) represents a node that is downstream from the first simulation event's node. Because each simulation event's scheduled condition is cumulative, to determine a given simulation event's schedule condition, the preceding simulation event's transition condition is ANDed with its schedule. Simulation event 280 is an "$N^{th}$" simulation event corresponding to an "$N^{th}$" node. In order to calculate the schedule condition of the "$N^{th}$" simulation event, the schedule condition of the simulation event for the preceding node (n−1) is simply ANDed with the transition condition for the "$(N-1)^{th}$" simulation event ($CS_n = CS_{n-1}$ & $CT_{n-1}$).

Figure 3:
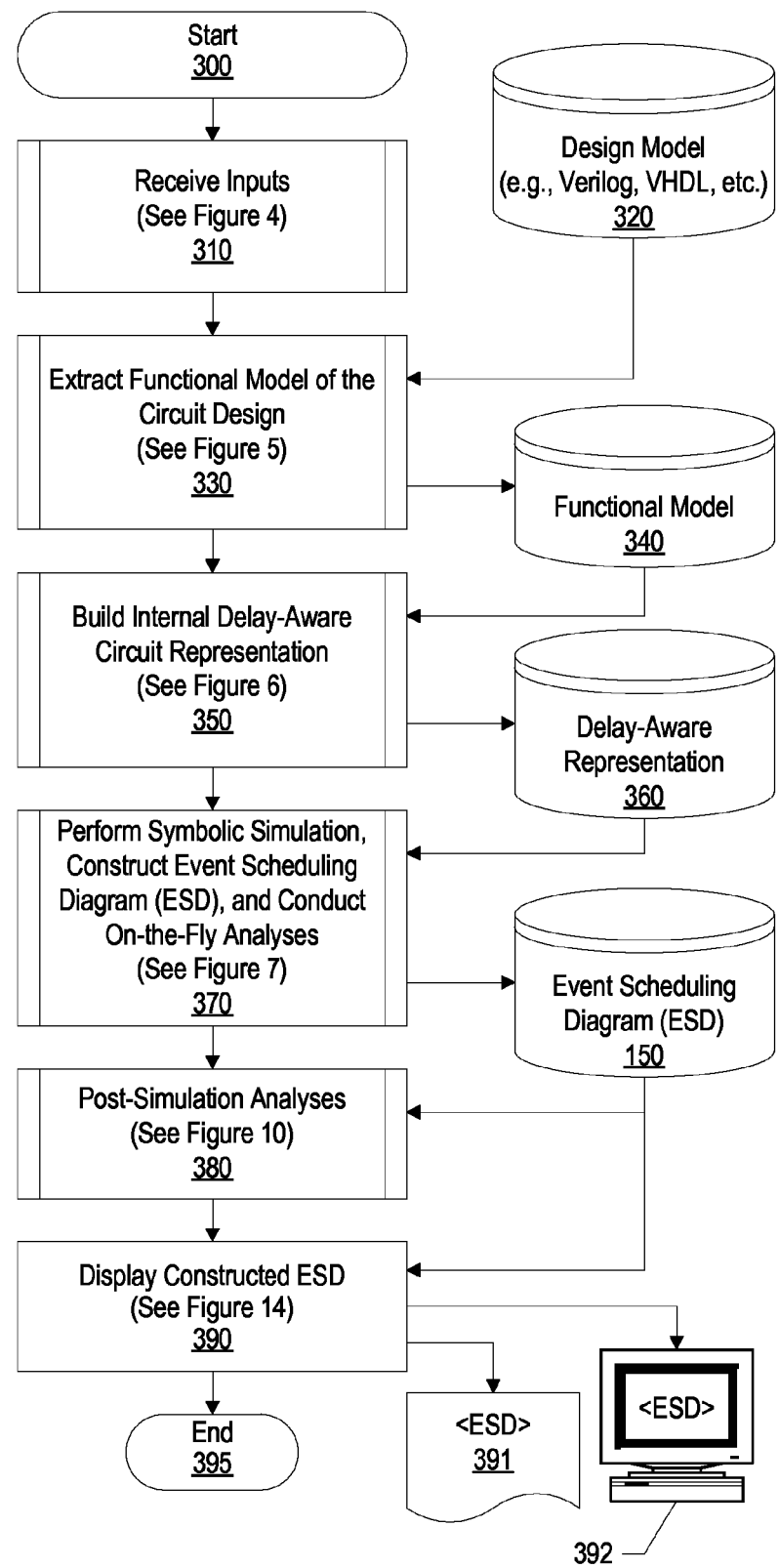
FIG. 3 is a high level flowchart of steps taken to construct an event scheduling diagram.

FIG. 3 is a high level flowchart of steps taken to construct and analyze an event scheduling diagram. Processing commences at 300 whereupon, at predefined process 310, the system receives inputs to use during the time-based symbolic simulation (see FIG. 4 and corresponding text for processing details of predefined process 310). One of the inputs received during predefined process 310 is an identifier (e.g., file name, etc.) of design model 320. Design model 320 is a circuit design in any of a number of modeling formats (e.g., Verilog, VHDL, etc.). At predefined process 330, the functional model of the circuit design is extracted from the identified design model (see FIG. 5 and corresponding text for processing details of predefined process 330). The result of predefined process 330 is functional model 340.

Figure 6:
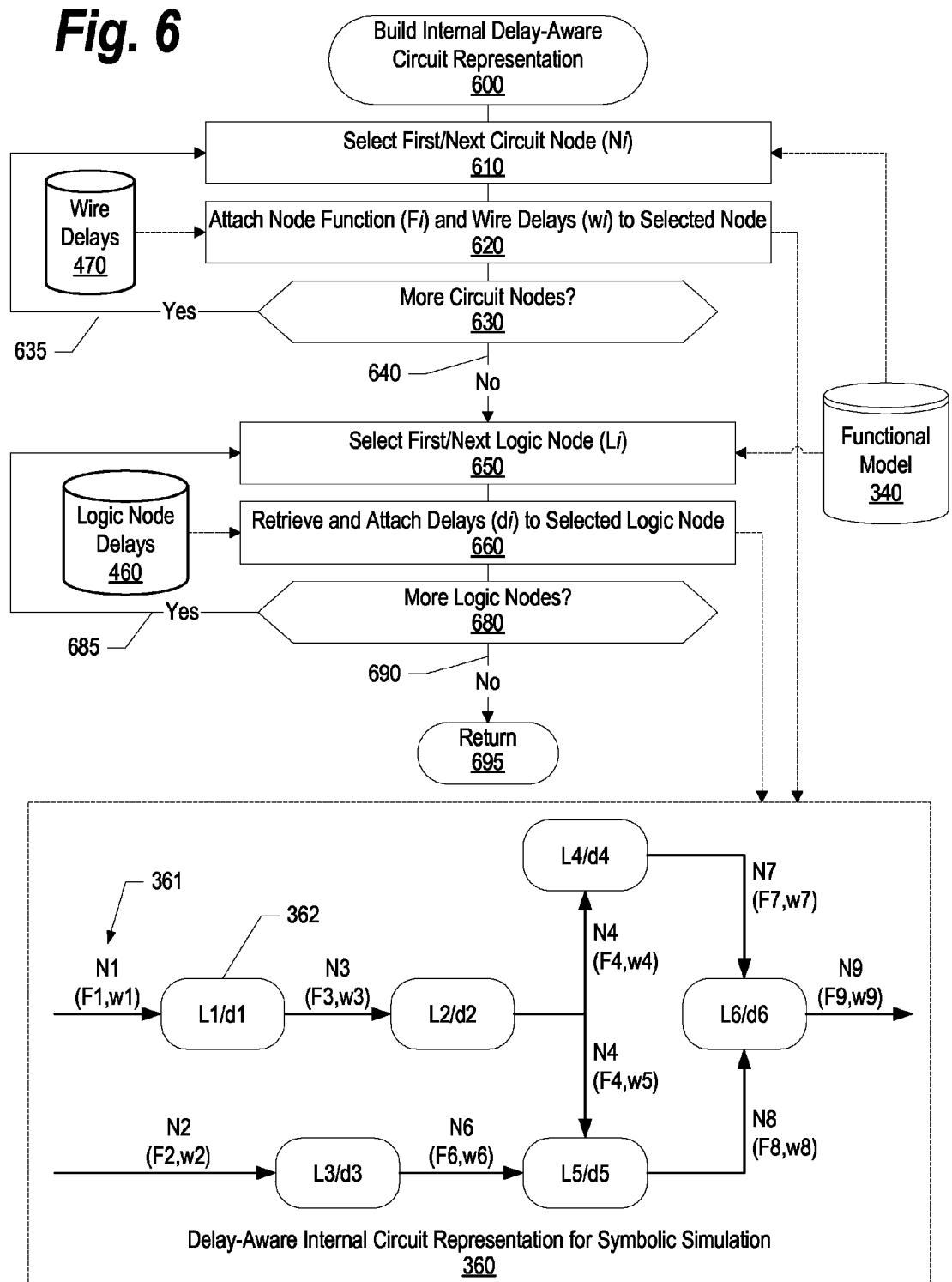
FIG. 6 is a flowchart showing the steps performed to build an internal delay-aware representation of the circuit design being simulated.

Functional model 340 is used as an input to predefined process 350 which builds an internal delay-aware circuit representation of the functional model (see FIG. 6 and corresponding text for processing details of predefined process 350). The result of predefined process 350 is delay-aware representation 360.

Predefined process 370 is performed using the delay-aware representation (360). During predefined process 370, the time-based symbolic simulation is performed, and the event scheduling diagram is constructed. In addition, on-the-fly circuit analyses (as opposed to post-simulation analyses) are performed during predefined process 370. See FIG. 7 and corresponding text for processing details). The result of predefined process 370 is event scheduling diagram 150. After symbolic simulation has been performed, event scheduling diagram 150 is used to conduct post-simulation timing analyses (predefined process 380, see FIG. 10 and corresponding text for processing details).

At step 390, event scheduling diagram 150 resulting from the time-based symbolic simulation is displayed (e.g., on printout 391, on computer display 392, etc.). Processing thereafter ends at 395.

Figure 4:
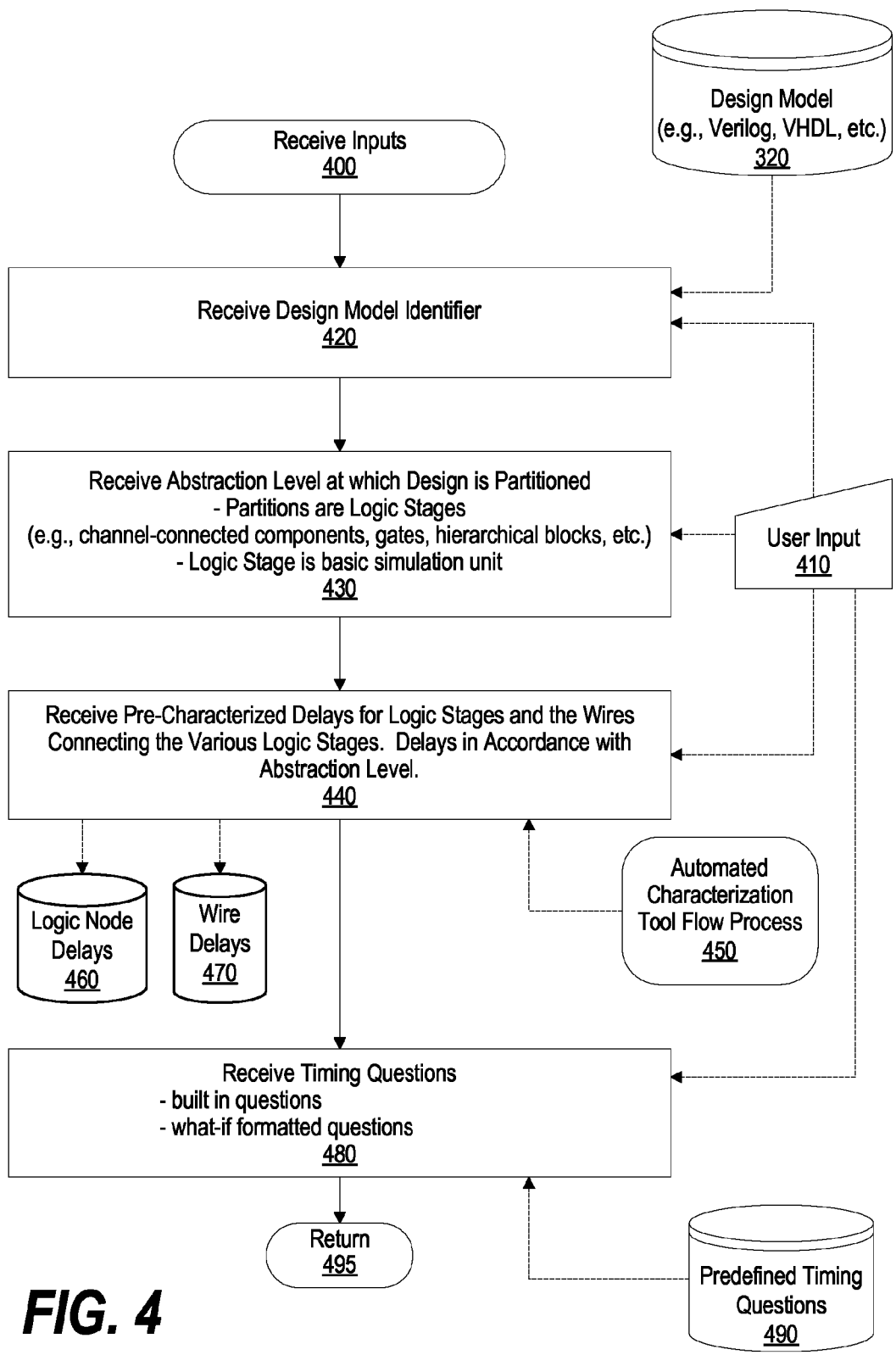
FIG. 4 is a flowchart showing the steps performed while receiving inputs to commence the time-based simulation process.

FIG. 4 is a flowchart showing the steps performed while receiving inputs to commence the time-based simulation process. Processing commences at 400, whereupon, at step 420, the design model identifier corresponding to the circuit design that will be simulated (design model 320) is received from the user (user input 410). At step 430, the abstraction level at which the design is partitioned is received from the user. Partitions are logic stages of the design. Examples of abstraction levels include channel-connected components, logic gates, hierarchical blocks, etc. During the time-based symbolic simulation, the logic stage is used as the basic simulation unit.

At step 440, the pre-characterized delays for logic stages and the conductive paths (e.g., wires) that connect the various logic stages are received and stored in data stores 460 and 470, respectively. The delays of the logic stages are in accordance with the abstraction level chosen by the user. As shown, the pre-characterized delays can be provided by the user (user input 410) and can also be provided by automated characterization tool flow process 450 that automatically characterizes delays for logic stages. A logic stage often has two pre-characterized delays—one representing the delay when the node "rises" (e.g., is "pulled up"), and another representing the delay when the node "falls" (e.g., is "pulled down"). The delay values for the node rising or falling may be the same or may be different based upon the characteristics of the particular node. For example, the multiplexer shown in FIG. 13 has a three cycle delay when the multiplexer is "pulled up" (rises), and a five cycle delay when the multiplexer is "pulled down" (falls). This occurs due to differences in pull-up and pull-down paths and associated physical characteristics called capacitance and resistance.

Returning to FIG. 4, at step 480, timing questions are received. The timing questions may be posed by the user and received through user input 410 and may include predefined timing questions stored in data store 490. Timing questions can be built-in questions as well as "what-if" formatted questions. After the various inputs have been received, processing returns to the calling routine at 495.

Figure 5:
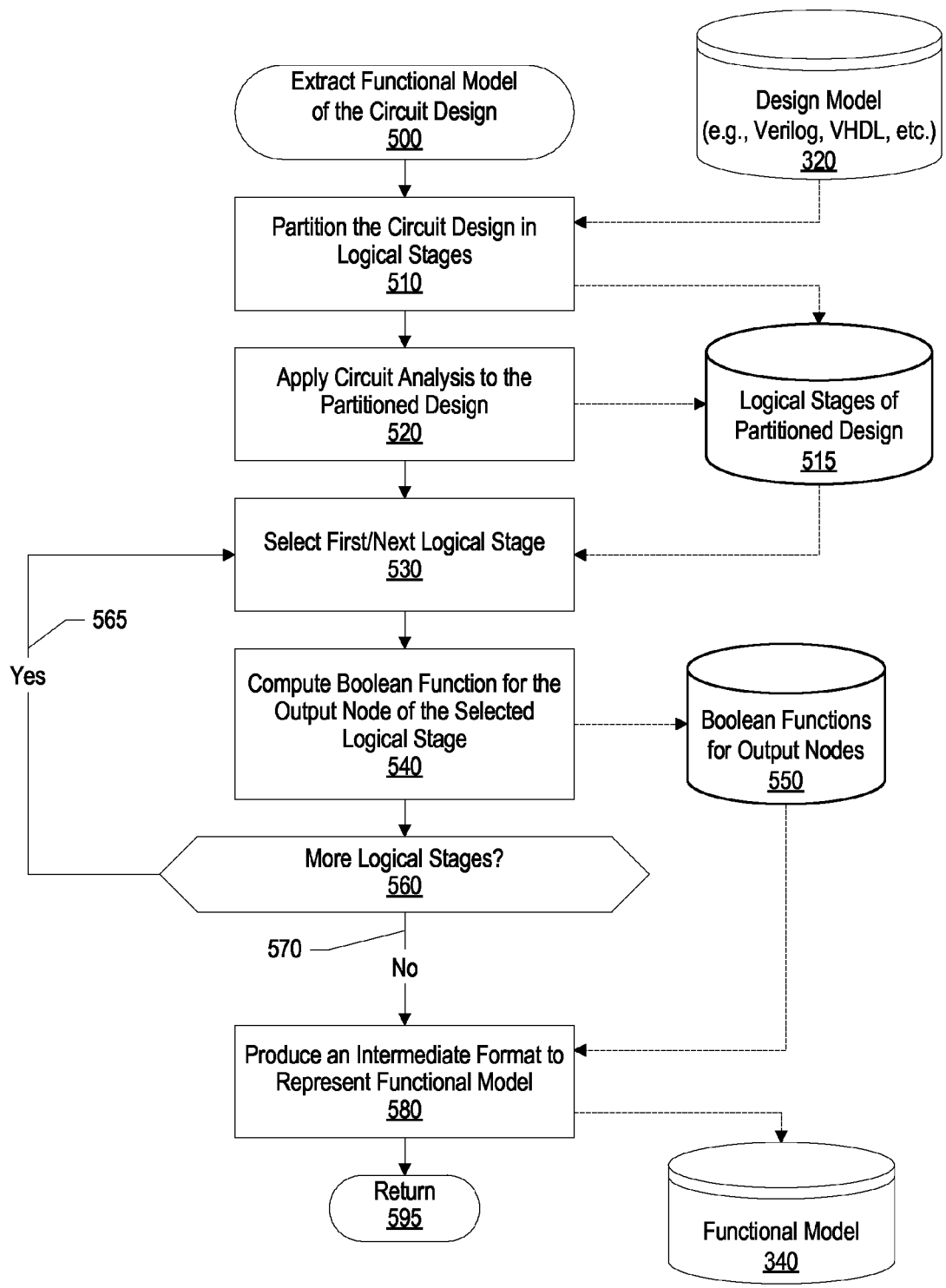
FIG. 5 is a flowchart showing the steps performed to extract a functional model of the circuit design that is being simulated.

FIG. 5 is a flowchart showing the steps performed to extract a functional model of the circuit design that is being simulated. Processing commences at 500 whereupon, at step 510, design model 320 is partitioned into logical stages according to the abstraction level that was chosen by the user. The logical stages of the partitioned circuit design are stored in data store 515. At step 520, circuit analysis is applied to the logical stages of the partitioned design. At step 530, the first logical stage is selected from data store 515. At step 540, a Boolean function is computed for the output node of the selected logical stage and stored in data store 550. Each circuit node is associated with two sets of Boolean functions: a pullup set and a pulldown set. Each Boolean function is a conjunctive Boolean expression that involves only Boolean variables and/or their negative forms (commonly referred to as a single cube). The Boolean expression represents a single functional path from one or more inputs to a single output node of a logic stage.

A determination is made as to whether there are more logical stages in the partitioned design (decision 560). If there are more logical stages, decision 560 branches to "yes" branch 565 which loops back to select the next logical stage from partitioned design 515 and compute the Boolean function for the output node of the newly selected logical stage. This looping continues until there are no more logical stages to process, at which point decision 560 branches to "no" branch 570.

At step 580, an intermediate format is produced to represent the functional model (functional model 340) that includes the Boolean functions. As the Boolean expression can include more than one Boolean function, it is referred to as a "Boolean function set." For example, consider a circuit consisting of a single AND gate with input node A and B and output node C. The functional model of the circuit is (where PU stands for pullup and PD for pulldown function set):

PU(A)={A}, PD(A)={!A}
PU(B)={B}, PD(B)={!B}
PU(C)={A&B}, PD(C)={!A, !B}

After the intermediate format, described above, has been produced and stored, processing returns to the calling routine at 595.

FIG. 6 is a flowchart showing the steps performed to build an internal delay-aware representation of the circuit design being simulated. A delay-aware representation include circuit components, such as gates, latches, etc., as well as timing, or "delay" information regarding the circuit components as well as delays corresponding to the time needed for signals to travel over conductive paths. One example of a conductive path is a wire that connects circuit nodes. Processing commences at 600 whereupon, at step 610, the first circuit node (N1) is selected from functional model 340. Functional model 340 includes the Boolean functions for the output nodes of the logical stages. At step 620, the Boolean function (Fi) for the circuit node and wire delays (wi) are attached to the selected circuit node in the delay-aware internal circuit representation (360) that will be used for symbolic simulation. In one embodiment, the wire delays are retrieved from wire delays data store 470. In other embodiments, the wire delays can either be ignored or can be computed based upon the wiring characteristics (e.g., wire length, etc.). A determination is made as to whether there are more circuit nodes to process (decision 630). If there are additional circuit nodes to process from functional model 340, then decision 630 branches to "yes" branch 635 which loops back to select the next circuit node (e.g., N2, N3, etc.) and attach the circuit node's Boolean function and wire delay. This looping continues until there are no more circuit nodes to process, at which time decision 630 branches to "no" branch 640.

At step 650, the first logic node (L1) is selected from functional model 340. At step 660, the delays (di) associated with the selected logical node are retrieved from logic node delays data store 460 and attached to the delay-aware internal circuit representation (360) that will be used for symbolic simulation. A determination is made as to whether there are more logic nodes to process (decision 680). If there are more logic nodes to process, then decision 680 branches to "yes" branch 685 and processing loops back to select the next logic node (e.g., L2, L3, etc.) from functional model 340 and retrieve and attach delays associated with the newly selected logic node. When all of the logic nodes have been processed, decision 680 branches to "no" branch 690 whereupon processing returns at 695.

An example delay-aware internal circuit representation (360) is shown at the bottom of FIG. 6. Note that each line represents a circuit node (N1, N2, etc). Each circuit node "Ni" is labeled with a node function "Fi" which includes both pull-up and pull-down functions of Ni. Each circuit node also has a wire delay (W1, W2, etc.) corresponding to each of its downstream logic stages. The circuit nodes connect to logic stages (L1, L2, etc.). Each circuit node (Ni) appears on the wire connecting two logic stages, with the arrow indicating the direction of signal flow. In the example, note that circuit node N4 connects to two different logic stages (L4 and L5), however a different wire delay (W4 and W5) is applied to these connections because the wire delay between L2 and L4 may be different from the wire delay between L2 and L5. One example of a logic stage would be a multiplexer. Note that each logic stage (Li) is attached to a pre-characterized delay (di), as described in step 660.

Figure 7:
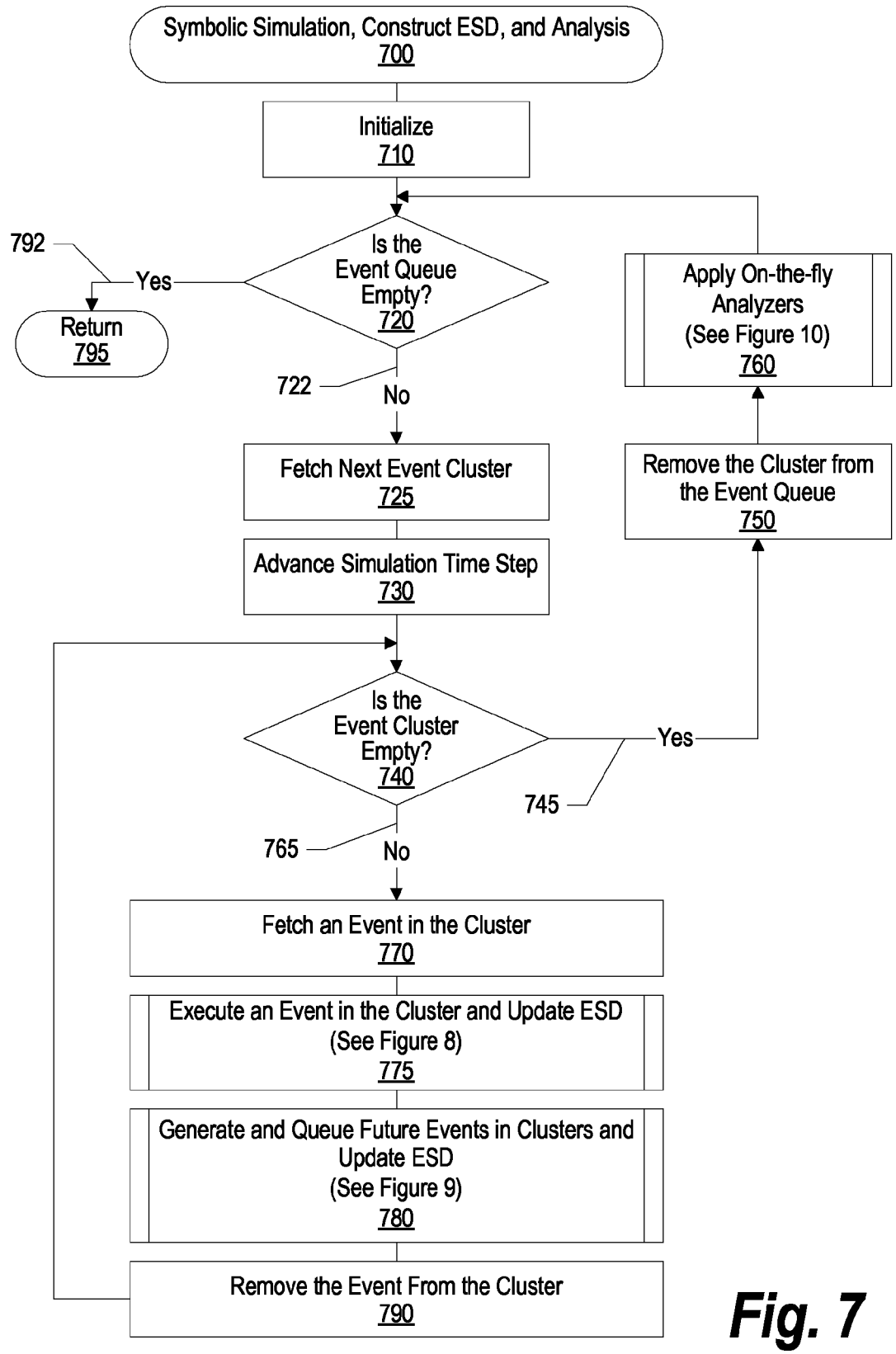
FIG. 7 is a flowchart showing the steps taken to perform symbolic simulation and construct/analyze the resulting event scheduling diagram.

FIG. 7 is a flowchart showing the steps taken to perform symbolic simulation and construct/analyze the resulting event scheduling diagram. Processing commences at 700 whereupon, at step 710, simulation processing is initialized. Simulation initialization includes populating the event queue with events generated from symbolic input vectors. As previously shown and described in FIG. 1, events are organized in clusters and events that are to occur at the same time are placed in one cluster. Therefore events in a cluster share the same time stamp. The event queue effectively consists of event clusters in the chronological order. When a new event is queued, a cluster is created (if none exists with the same time stamp) or an existing cluster is found to hold the new event. A newly created cluster is placed in the simulation event queue according to its time stamp. Also during step 710, the data structure used to represent the event scheduling diagram is initialized, and analyzers are created and registered based on the timing questions provided at step 480 of FIG. 4.

A determination is made as to whether the event queue is empty (decision 720). Decision 720 forms the exit condition of an outer loop capturing the simulation process. The simulation is driven by events residing in the simulation event cluster in the simulation event queue. The simulation terminates when all events are processed and no event cluster remains in the queue. If the simulation event queue is not empty, decision 720 branches to "no" branch 722 whereupon, at step 725 the next simulation event cluster is fetched, and at step 730 the simulation time is advanced to the next event cluster time. The simulation event clusters are ordered chronologically in the simulation event queue. The simulation event cluster with the smallest timestamp in the simulation event queue is fetched at step 725. Step 730 advances the simulation as indicated by the timestamp of the simulation event cluster fetched in step 725. The advance to the next time step marks the elapse of time and brings simulation to the next point upon which future event scheduling is based.

A determination is made as to whether the current simulation event queue is empty (decision 740) Decision 740 forms the exit condition of an inner loop taking place at the particular time step set in step 730. If the simulation event queue is not empty, decision 740 branches to "no" branch 765 whereupon, at step 770, the next event in the current simulation event cluster is fetched and processed. Events in a cluster can be in any order as they occur during the same timestamp. A simulation event captures information needed for a circuit to transition to a new state. This information is described in FIG. 2 and includes Time (T) which indicates when the node transition takes place. This can be inferred from the time stamp of the cluster to which the event belongs. A simulation event consists of a circuit node (N) which is the node that is to transition to a new state when the event occurs; Transition direction (D) which indicates if the circuit node is to rise or to fall when the transition takes place; Transition condition (CT) which is the Boolean expression representing the condition under which the rise or fall transition is to take place for the circuit node involved; and the Cumulative transition condition (CS) which is the Boolean expression representing the cumulative condition along the chain of the events leading to the current event. The fetched event is executed and the event scheduling diagram is updated at predefined process 775 (see FIG. 8 and corresponding text for processing details). At predefined process 780, future events are generated and queued in future simulation event clusters and the event scheduling diagram is updated accordingly (see FIG. 9 and corresponding text for processing details). When a circuit node transitions to a new state, it triggers its fanout logic stages to evaluate and may, as a result, change states of nodes connecting to the outputs of those logic stages. This results in the generation and queuing of new events to capture those node transitions at future times, taking into account the delay through the logic stages and along the interconnect wires. It is noteworthy that newly generated events can be placed in the cluster that is currently being processed if processing zero-delay logic stages and interconnect wires. New clusters are formed and placed in the queue if a new time stamp is encountered.

After the event has been executed and future events stemming from the event have been generated and queued, at step 790, the event is removed from the simulation event cluster and processing loops back to process the next event in the cluster. This looping continues until all events in the simulation event queue have been processed, at which point, decision 740 branches to "yes" branch 745. At step 750, the cluster that was just processed is removed from the simulation event queue as there are no more events from the cluster that need to be processed. Analysis of events can take place both during simulation and after simulation completes. At predefined process 760, "on-the-fly" analyzers are applied (see FIG. 10 and corresponding text for processing details). The on-the-fly analyzer are those with analyses to be performed while simulation is still in progress. Predefined process 760 includes fetching an analyzer from the registered analyzer list, and checking if the predicate of the fetched analyzer holds TRUE at the current simulation time. If YES (the predicate of the fetched analyzer holds TRUE at the current simulation time), the analyzer is applied at the current simulation time.

Figure 8:
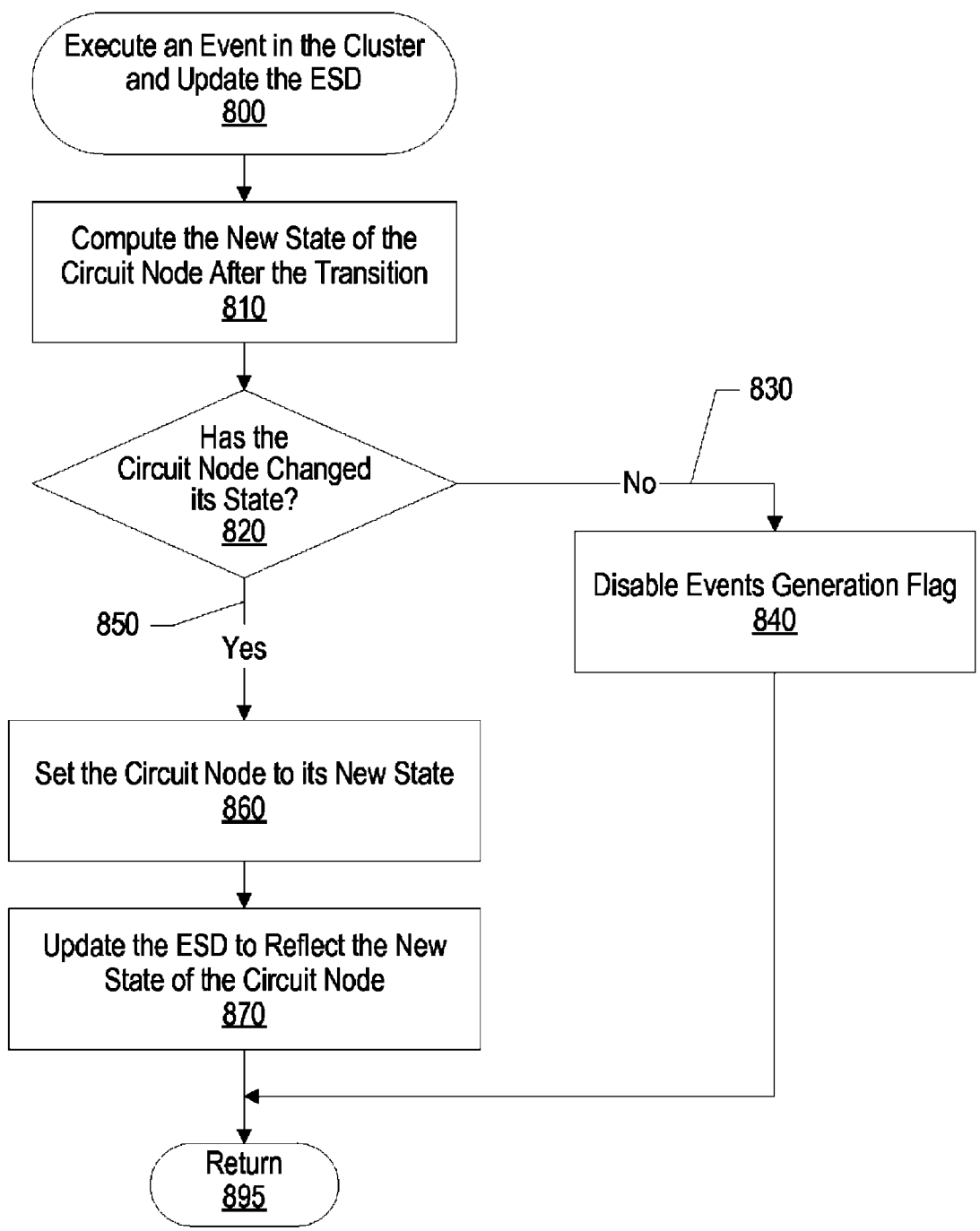
FIG. 8 is a flowchart showing the steps taken to execute an event in a specified cluster and update the event scheduling diagram.

FIG. 8 is a flowchart showing the steps taken to execute an event in a specified cluster and update the event scheduling diagram. Processing commences at 800 whereupon, at step 810, given an event whose transition is being executed, the new state of the circuit node involved in the event is computed. The state of a circuit node is represented by a pair of Boolean expressions—one for the pullup function and the other for the pulldown function. The new pullup (or pulldown depending on the transition direction) is obtained by disjuncting the current pullup (or pulldown) and the transition condition of the current event.

A determination is made as to whether the circuit node has changed state (decision 820). Decision 820 checks if the circuit node will change state as result of executing the transition. An equality test is performed on the newly computed pullup (or pulldown) function against the current function held by the circuit node. If the circuit node remains the same state after the transition, decision 820 branches to "no" branch 830 whereupon, at step 840, the flag for event generation is disabled as there will be no evaluation of fanout logic stages of the circuit node. The flag is not required if the execution phase (predefined process 775 of FIG. 7) and event generation phase (predefined process 780 of FIG. 7) of the event is merged into one. It is introduced here in order to pass information from one phase to another. After the events generation flag has been disabled, processing returns to the calling routine at 895.

If the circuit node changes state after the transition, then decision 820 branches to "yes" branch 850 whereupon, at step 860 the circuit node is transitioned to its new state and, at step 870, the event scheduling diagram is updated with the changed circuit node state. When event transition is executed, the transitioned circuit node involved may change state. The changed node state is reflected in annotation of the ESD node that corresponds to the current simulation time. After the event scheduling diagram has been updated, processing returns to the calling routine at 895.

Figure 9:
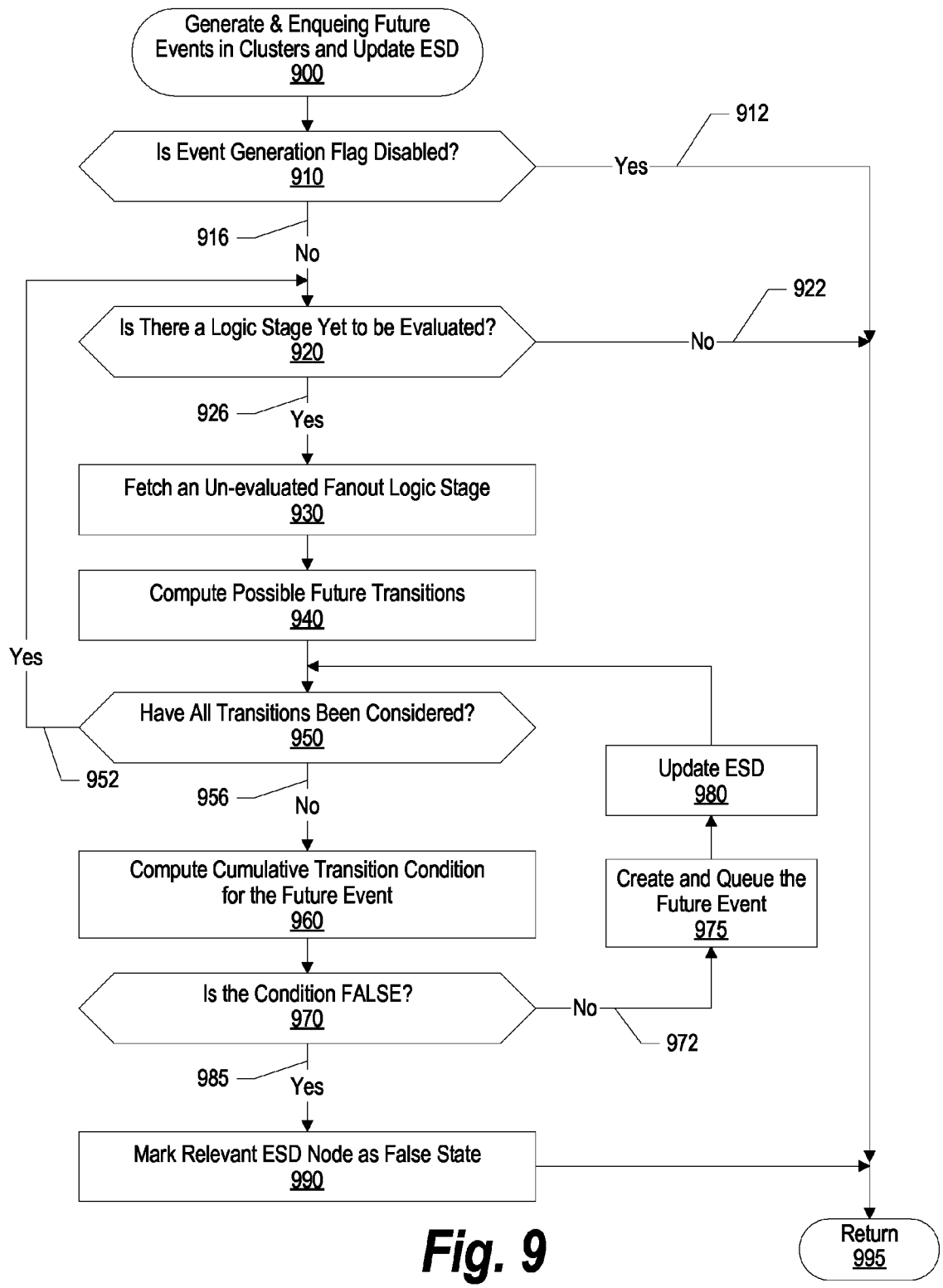
FIG. 9 is a flowchart showing the steps taken to generate and queue future events in clusters and update the event scheduling diagram.

FIG. 9 is a flowchart showing the steps taken to generate and queue future events in clusters and update the event scheduling diagram. Processing commences at 900 whereupon, a determination is made as to whether the event generation flag is disabled for the event that is currently being processed (decision 910). If the event generation flag has been disabled, then decision 910 branches to "yes" branch 912 bypassing the remaining steps of FIG. 9 and processing returns to the calling routine at 995. On the other hand, if the event generation flag has not been disabled, then decision 910 branches to "no" branch 916 whereupon another determination is made as to whether there is a logic stage that has yet to be evaluated (decision 920). During decision 920, processing checks to determine if the circuit node involved in the event fans out to any logic stage and checks if all of its fanout logic stages have been computed. Decision 920 forms an exit condition for an outer loop to process all fanout logic stages of the circuit node. So long as there are logic stages yet to be evaluated, decision 920 branches to "yes" branch 926 in order to process the next logic stage. When all logic stages have been processed, decision 920 branches to "no" branch 922 and processing returns to the calling routine at 995.

If there is at least one logic stage yet to be evaluated, decision 920 branches to "yes" branch 926 whereupon, at step 930, a fanout logic stage that has not yet been evaluated is fetched. At step 940, the possible future transitions of the logic stage are computed. Using the functions of the logic stage compute information for all possible transitions of the output node of the fetched logic stage. The computation produces the following information for each possible transition for a given event (T, N, D, CT, CS):

Circuit node N': N' being one of the outputs nodes of the fetched logic stage.
Direction of the node transition D':
D'=RISE if pullup (N')≠FALSE
D+=FALL if pulldown (N')≠FALSE
Note that a circuit node can both rise and fall, but under different transition conditions. These different transition conditions will be scheduled as separate events.
Condition for the transition to occur CT':
CT'=f where f=pullup or pulldown function depending on the direction of transition of the node involved.
Time when the future transition takes place T':
T'=T+delay (including logic stage and wire delays)

A determination is made as to whether all transitions have been considered for the fetched logic stage (decision 950). Decision 950 forms the exit condition for an inner loop that processes all possible transitions as result of evaluating the fetched logic stage. If all transitions have not been considered, decision 950 branches to "no" branch 956 whereupon, at step 960, the cumulative transition condition is computed for the future event. Given a possible transition, processing conjuncts the condition of the transition (CT) with the cumulative transition condition (CS) of the event currently being processed in order to identify the cumulative transition condition for the future event. A determination is made as to whether the conjunction of the condition of the transition (CT) with the cumulative transition condition (CS) results in a FALSE condition (decision 970). If the new cumulative transition condition (CS) is FALSE, the future transition is not possible and decision 970 branches to "yes" branch 985 whereupon, at step 990, no new event will be generated for the transition. The event scheduling diagram node with the current simulation time stamp is marked for the false path analysis. In the dual-mux example shown in FIG. 13, the nodes with time stamp 6 and 10 will be thus marked because if there were events to be generated, the cumulative transition conditions for those events would be FALSE (!c & (c & a)=FALSE; and c & (!c & a)=FALSE).

Returning to FIG. 9, if the new cumulative transition condition (CS) is not FALSE, the future transition is possible and decision 970 branches to "no" branch 972. Following branch 972, a new event for the transition is created at step 975 and the newly created event is scheduled by queuing it to a simulation event cluster within the simulation event queue. At step 980, the event scheduling diagram is updated to reflect the occurrence of the new event that was created and scheduled in step 975. The updating of the event scheduling diagram includes creating an event scheduling diagram node with the time stamp of the scheduled event if no event scheduling diagram node currently exists with the time stamp. Note that the ESD node with the time stamp may be present through previous event scheduling. The state for the future circuit node is not updated yet because the event has not yet occurred. Updating the event scheduling diagram also includes adding an edge from the event scheduling diagram node with the current simulation time to the event scheduling diagram node with the time stamp of the scheduled event. Updating the event scheduling diagram also includes updating the annotation of the edge with the pair of current event and the newly scheduled event.

Figure 10:
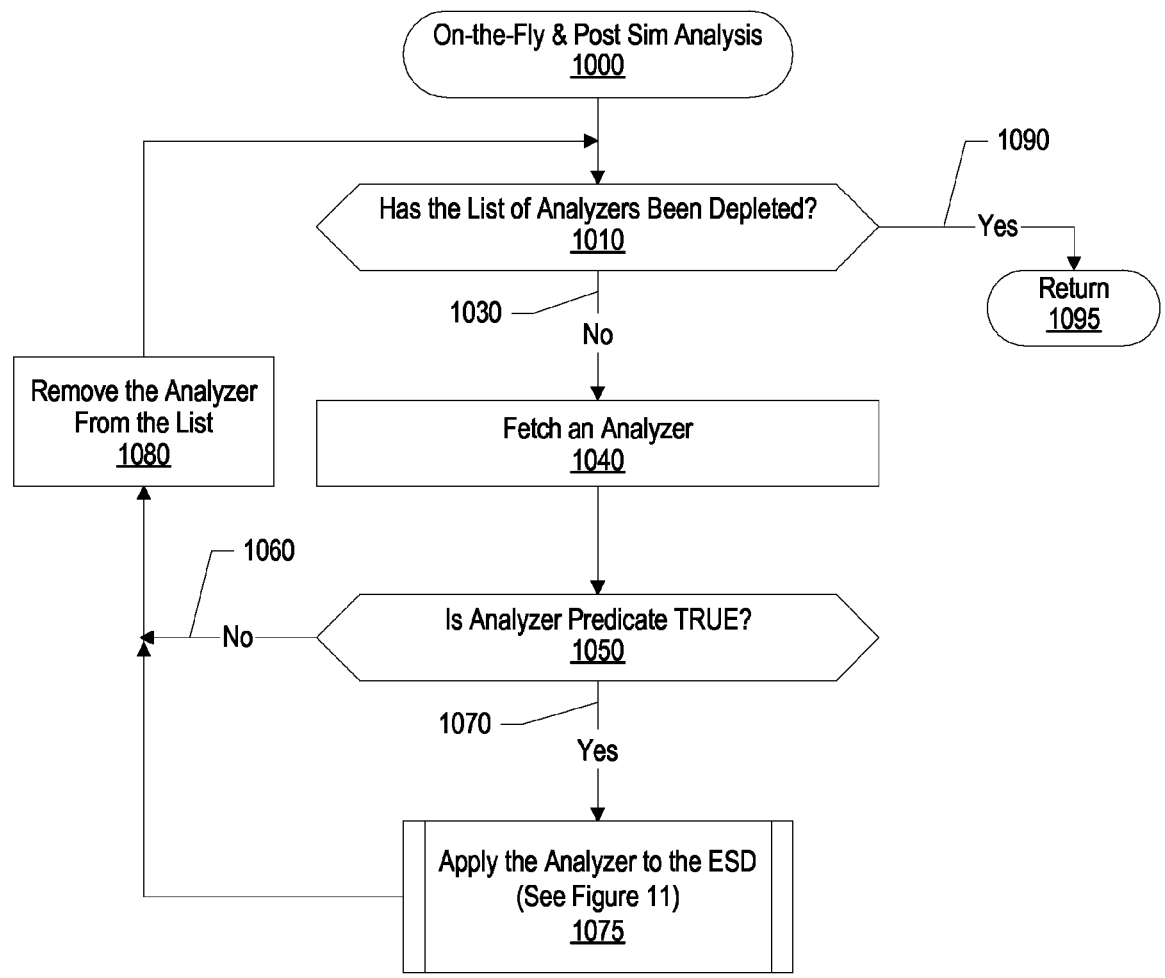
FIG. 10 a flowchart showing the steps taken during on-the-fly and post-simulation analysis.

FIG. 10 a flowchart showing the steps taken during on-the-fly and post-simulation analysis. Processing commences at 1000 whereupon, a determination is made as to whether the list of analyzers has been depleted (decision 1010). Decision 1010 forms the exit condition for a loop that captures the event scheduling diagram based timing analysis process. If the list of analyzers has not been depleted, then decision 1010 branches to "no" branch 1030 whereupon, at step 1040, an analyzer is fetched. For an example of a list of analyzers, see FIG. 12. Returning to FIG. 10, a determination is made as to whether the analyzer predicate is TRUE (decision 1050). If the fetched analyzer's predicate is TRUE, then decision 1050 branches to "yes" branch 1070 whereupon the fetched analyzer is applied to the event scheduling diagram (predefined process 1075, see FIG. 11 and corresponding text for processing details). On the other hand, if the fetched analyzer's predicate is FALSE, then decision 1050 branches to "no" branch 1060 bypassing step 1075.

At step 1080, the fetched analyzer is removed from the list of analyzers and processing loops back to determine if there are more analyzers to process. This looping continues while there are analyzers to process. When the list of analyzers has been depleted (exhausted), then decision 1010 branches to "yes" branch 1090 and processing returns to the calling routine at 1095.

Figure 11:
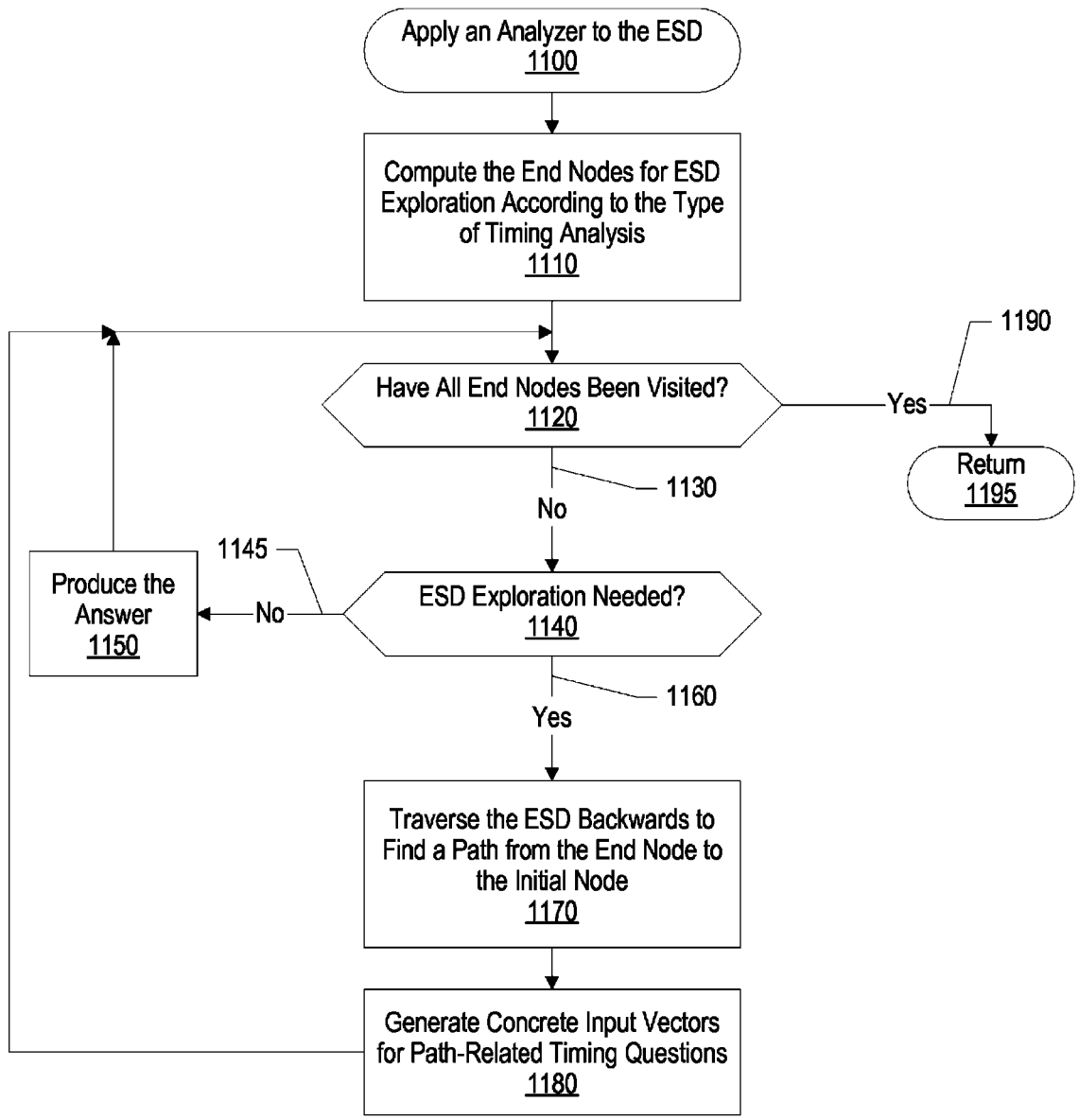
FIG. 11 is a flowchart showing the steps taken to apply an analyzer to the event scheduling diagram.

FIG. 11 is a flowchart showing the steps taken to apply an analyzer to the event scheduling diagram. Timing analysis involves examining a particular event scheduling diagram node or exploring the event scheduling diagram using some graph exploration algorithm and producing answers or results for the timing question posed by the user. Because the event scheduling diagram is a compact representation of all possible scenarios of event scheduling during simulation, an event scheduling diagram path corresponds to possible event sequences between the start and end event scheduling diagram nodes on the path. The exploration of an event scheduling diagram involves uncovering individual event sequences on an event scheduling diagram path.

Processing commences at 1100 whereupon, at step 1110, for each type of timing question, the event scheduling diagram end nodes are computed for the exploration to start. These event scheduling diagram nodes are termed as "end nodes" as they appear as the end nodes on the paths that are to be explored during the analysis. A determination is made as to whether all end nodes have been visited (decision 1120). Decision 1120 forms the exit condition of the loop that goes through each end node in turn and traverses the ESD backwards beginning at the node. So long as all end nodes have not yet been visited, decision 1120 branches to "no" branch 1130 whereupon a determination is made as to whether event scheduling diagram exploration is needed for the given analysis (decision 1140, see FIG. 12 for examples of different types of analyses). If event scheduling diagram exploration is not needed, decision 1140 branches to "no" branch 1145 whereupon processing analyzes the event scheduling diagram end node and, at step 1150, an answer is produced for the event scheduling diagram end node. Processing then loops back to process any end nodes that have not yet been processed.

On the other hand, if event scheduling diagram exploration is needed, decision 1140 branches to "yes" branch 1160 whereupon, at step 1170, the event scheduling diagram is traversed backwards in order to find a path from the end node to the initial node. The traversal uncovers individual event sequences that might happen between the end and the initial nodes of the current event scheduling diagram. Any graph exploration technique known by those skilled in the art can be used in the backward traversal.

At step 1180, for path-related timing questions, concrete input vectors are generated to sensitizing the path that corresponds to the uncovered event sequence. When the initial event scheduling diagram node is reached, an event scheduling diagram path is formed by event scheduling diagram nodes between the current end node and the initial node inclusively. The condition for the event scheduling diagram path is obtained from the cumulative transition condition of the last event on the path (CS) and is used to generate sensitizing input vectors for the path. Processing then loops back to process any end nodes that have not yet been processed. This looping continues until all end nodes have been visited, at which point decision 1120 branches to "yes" branch 1190 and processing returns to the calling routine at 1195.

FIG. 12 is a diagram showing the predicates for the various analyses of the event scheduling diagram. Timing analyses can be performed either post-simulation or on-the-fly. More efficiently they can be performed whenever simulation reaches a point where certain timing questions can be answered. The analysis predicate is introduced to represent the condition under which the associated analysis is to be conducted. For example, the analyzer created for the query of circuit node states at certain time can have a predicate to check the current simulation time against the time for analysis. The predicate is not necessary if all analyses are to be done post-simulation.

List of analyses 1200 includes data corresponding to a variety of analyses that can be performed during simulation (on-the-fly analyses) as well as analyses that can be performed post-simulation. Analysis column 1210 details various types of analyses. Analysis predicate column 1220 details various types of analysis predicates that is used to determine whether an analysis should be performed at a certain simulation point. Typical analysis predicates, shown in FIG. 12, includes "sim_done" which indicates that a given analysis should be performed post-simulation (when simulation terminates). Another analysis predicate is "sim_stable" which indicates that the analysis should be performed when the simulation reaches a stable state. Another "on-the-fly" analysis predicate is "sim_time" (e.g., sim_time==<required analysis time>), which indicates that a given analysis should be performed when the current simulation time matches the required analysis specified when the user answered the timing questions. Another predicate is the "TRUE" predicate that indicates that the given analysis can be performed at any simulation step. Column 1230 details the end event scheduling diagram node that is used for the given analysis during event scheduling diagram exploration. Finally, column 1240 indicates whether event scheduling diagram exploration is required for the various types of analyses.

The sim_done and sim_stable predicates can be checked by querying the state of the simulation engine. The "sim_time" predicate involves an equality test between the current simulation time and the required analysis time specified in a timing question. An analysis with a predicate of "TRUE" is performed at each simulation step. On-the-fly analyses are those with predicates of "sim_stable", "sim_time", and "TRUE", as the simulation is still in progress when these analyses are performed. Each analyses is based on the event scheduling diagram that is either partially constructed (for on-the-fly analyses) or fully constructed (for post-simulation analyses).

Figure 13:
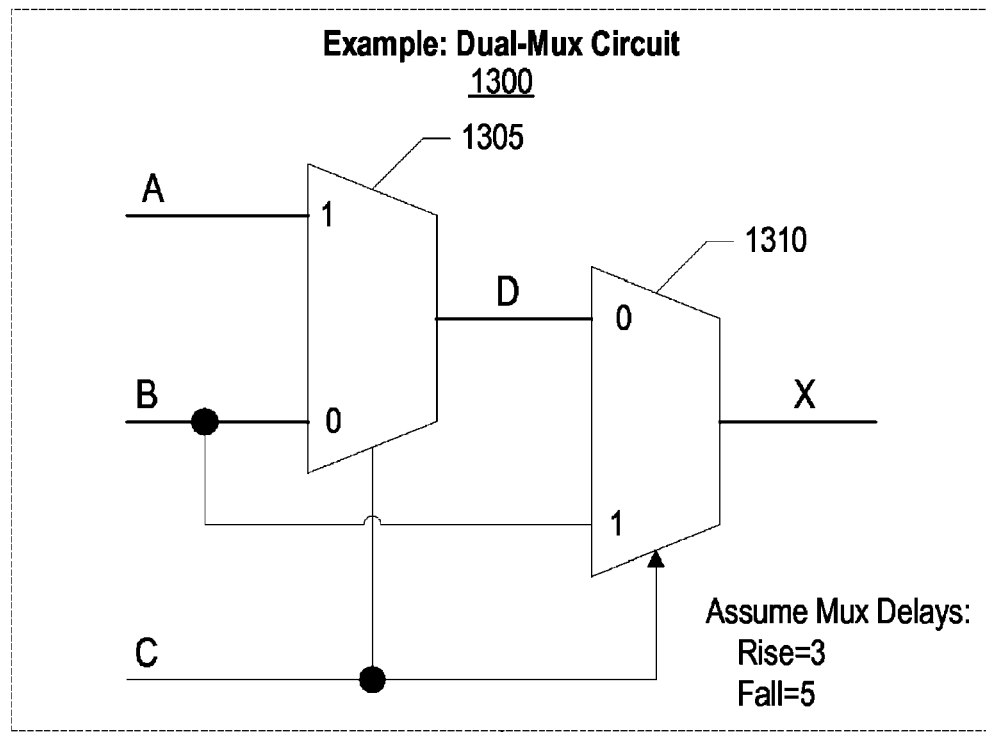
FIG. 13 is a diagram showing an example circuit and the corresponding internal circuit representation used in the time-based symbolic simulation.

FIG. 13 is a diagram showing an example circuit and the corresponding internal circuit representation used in the time-based symbolic simulation. Dual-multiplexer circuit 1300 includes first multiplexer 1305 and second multiplexer 1310. Each multiplexer is shown with a rise delay of 3 cycles and a fall delay of 5 cycles. Inputs to first multiplexer 1305 include signals A, B, and C. The result of first multiplexer 1305 is signal D. Inputs to second multiplexer 1310 include signals B, C, and D (with D being the result signal from first multiplexer 1305). The result of second multiplexer 1310 is signal X.

In the example shown in FIG. 13, assumptions regarding the circuit include (1) zero-delays for wires, rising and falling delays through the two multiplexers are 3 and 5, respectively, arrival times for inputs A, B, C are 0 for each input. Symbolic variables a, b and c are assigned to inputs A, B, C, respectively.

Dual multiplexer circuit 1300 is processed in order to create internal circuit representation 1320. The conditions under which a particular signal is pulled up or pulled down is expressed in terms of the other signals. For example the line in the internal representation "PD (X)={PU (C) & PD (B), PD (C) & PD (D)}" indicates the conditions where a pull down of signal X occurs. Namely, X is pulled down when a pull up of C and a pull down of B occur, or when a pull down of C and a pull down of D occur. Because the pull down of "X" depends on other signals, namely pull down of B, pull up and pull down of C, and pull down of D, the internal representations for the conditions where these other signals are pulled up and/or pulled down (shown preceding the pull down (PD) of X) are evaluated in order to determine the condition where signal X is pulled down.

Figure 14:
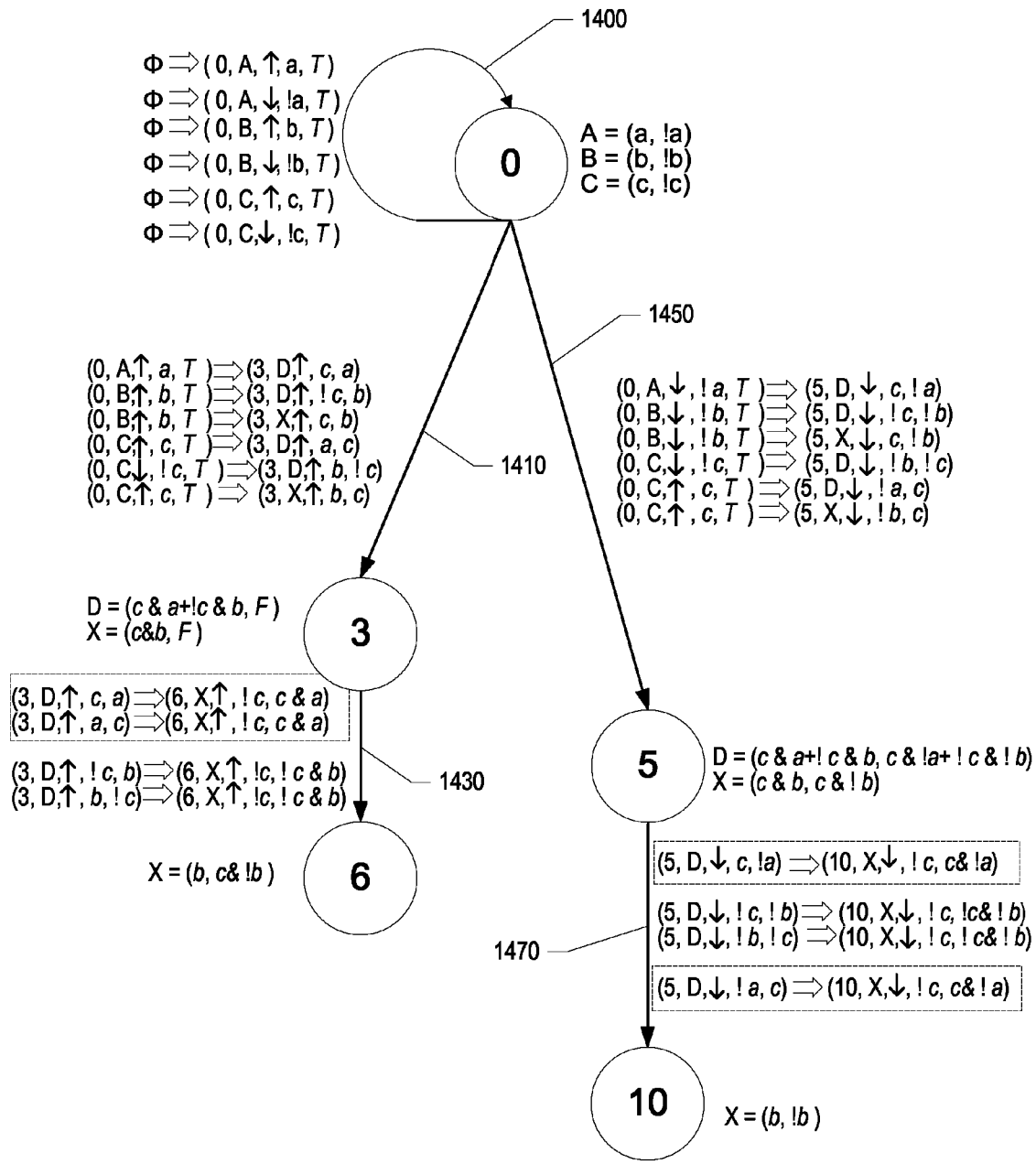
FIG. 14 is an event scheduling diagram resulting from the time-based symbolic simulation of the circuit shown in FIG. 13.

FIG. 14 is an event scheduling diagram resulting from the time-based symbolic simulation of the circuit shown in FIG. 13. The event scheduling diagram is aimed to capture information about event scheduling as it occurs during symbolic simulation and is designed to be compact for exploration and visualization.

The structure of the event scheduling diagram is a directed graph with nodes (depicted as circles) and edges (depicted as arrowed lines) connecting the nodes. Each event scheduling diagram node has a unique time stamp t (marked inside the circle) and is annotated with a collection of transitioned circuit nodes and their states at time t. The state of a circuit node is represented by the pullup and pulldown values (which are Boolean functions in a symbolic representation) of the node.

At the beginning of simulation all nodes, including primary inputs, are initially assigned value F (FALSE) for both pullup and pulldown functions. After the symbolic vectors have been applied to the primary inputs after a zero delay, they will transition to new states where their values assume the symbolic variables assigned to them. Thus we see the three transitioned nodes and their corresponding states at time 0.

| Node | Pullup | Pulldown |
|------|--------|----------|
| A    | a      | !a       |
| B    | b      | !b       |
| C    | c      | !c       |

The circuit nodes D and X can rise at time 3 after a delay of 3 time units. Therefore the pullup functions of the two nodes will be updated at time 3. However, because the falling transition take longer time (5 time unit) to occur, their pulldown functions are unknown at time 3. Hence their pulldown functions remain F. Note that, though updated, the pullup functions are partial because they are subject to future evaluation when further events get executed.

An ESD edge connects one ESD node to another. It represents the progression of simulation as result of the scheduling of events. Each ESD edge is annotated with a collection of event pairs. An event pair is represented by "E1⇒E2" where event E1 causes the scheduling of event E2. Edges 1410, 1430, 1450, and 1470 depict the various event pairs resulting from the dual multiplexer example shown in FIG. 13.

For an initial event E generated from the symbolic input vectors, the event pair will be represented by Φ⇒E where Φ indicates the absence of the event that trigger the scheduling of E. This is shown in the annotation of the self-pointed edge at the initial ESD node (1400). A simulation event is represented in a tuple of five elements:

| Time (T) | Node (N) | Transition Direction (D) | Transition Condition (CT) | Cumulative Transition Condition (CS) |
|----------|----------|--------------------------|---------------------------|--------------------------------------|
| 0        | A        | ↑                        | a                         | T                                    | where T stands for TRUE (F for FALSE).

In the event scheduling diagram of the dual-multiplexer example, the event pair "(0, A, ↑, a, T)⇒(3, D, ↑, c, a)" indicates that the event (0, A, ↑, a, T)—node A is to rise at time 0 when a is true under a TRUE condition—causes the scheduling of event (3, D, ↑, c, a)—node D is to rise at time 3 when c is true under the cumulative condition a, obtained by conjuncting CT and CS elements of the first event.

Suppose an event E=(T, N, D, CT, CS) probably triggers scheduling of some future event E'. If CT & CS of the event E evaluates to F (false), the transition of the future event E' becomes impossible. This fact indicates the presence of false path in the original circuit. In the event scheduling diagram of the dual-multiplexer example, the event pairs that are enclosed in dashed boxes are impossible.

At time of creation an ESD will have a single ESD -with all circuit node states having (F,F), i.e., both the pullup and pulldown functions of the circuit are FALSE, associated with it.

An ESD node is created when scheduling of an event occurs and the scheduled event has a time stamp that is different from the time stamps of all of the existing nodes. The value of circuit nodes maintained inside each ESD is known when the associated event has taken place.

ESD edges are also created upon occurrences of event scheduling. A newly created ESD edge connects the ESD node (referred to as source node with time stamp ts) with the current simulation time stamp to the ESD node with a time stamp no earlier than that of the source node (referred to as destination node with time stamp td). It is possible that the source node and the destination node are the same for zero delay logic stages. The edge annotation is added to reflect the scheduling of a new event triggered by the event that is currently being processed. The destination node annotation is updated when the event at td gets executed.

Exploration of the ESD is used to evaluate path-related timing questions, e.g. critical path and false path identification. Because the ESD is a compact representation of all possible scenarios of event scheduling during simulation, an ESD path corresponds to possible event sequences between the start and end ESD nodes on the path. The exploration of an ESD involves uncovering individual event sequences on an ESD path. The exploration is typically a backward traversal of the ESD.

Given a path-related timing question, ESD nodes are identified as the starting points of the backward traversal and thus they are referred to as end nodes. The edges to be explored next are those whose annotations contain an event pair E1⇒E2 where E2 matches the first element in the currently uncovered event sequence. After the identified edges are explored, E2 is then added to the front of the sequence.

In the dual-multiplexer example introduced in FIG. 13, the event sequences uncovered between ESD nodes at 6 and 0 after the exploration are:

Φ⇒(0, B, ↑, b, T)⇒(3, D, ↑, !c, b)⇒(6, X, ↑, !c, !c & b); and

Φ⇒(0, C, ↓, !c, T)⇒(3, D, ↑, b, !c)⇒(6, X, ↑, !c, !c & b)

Figure 15:
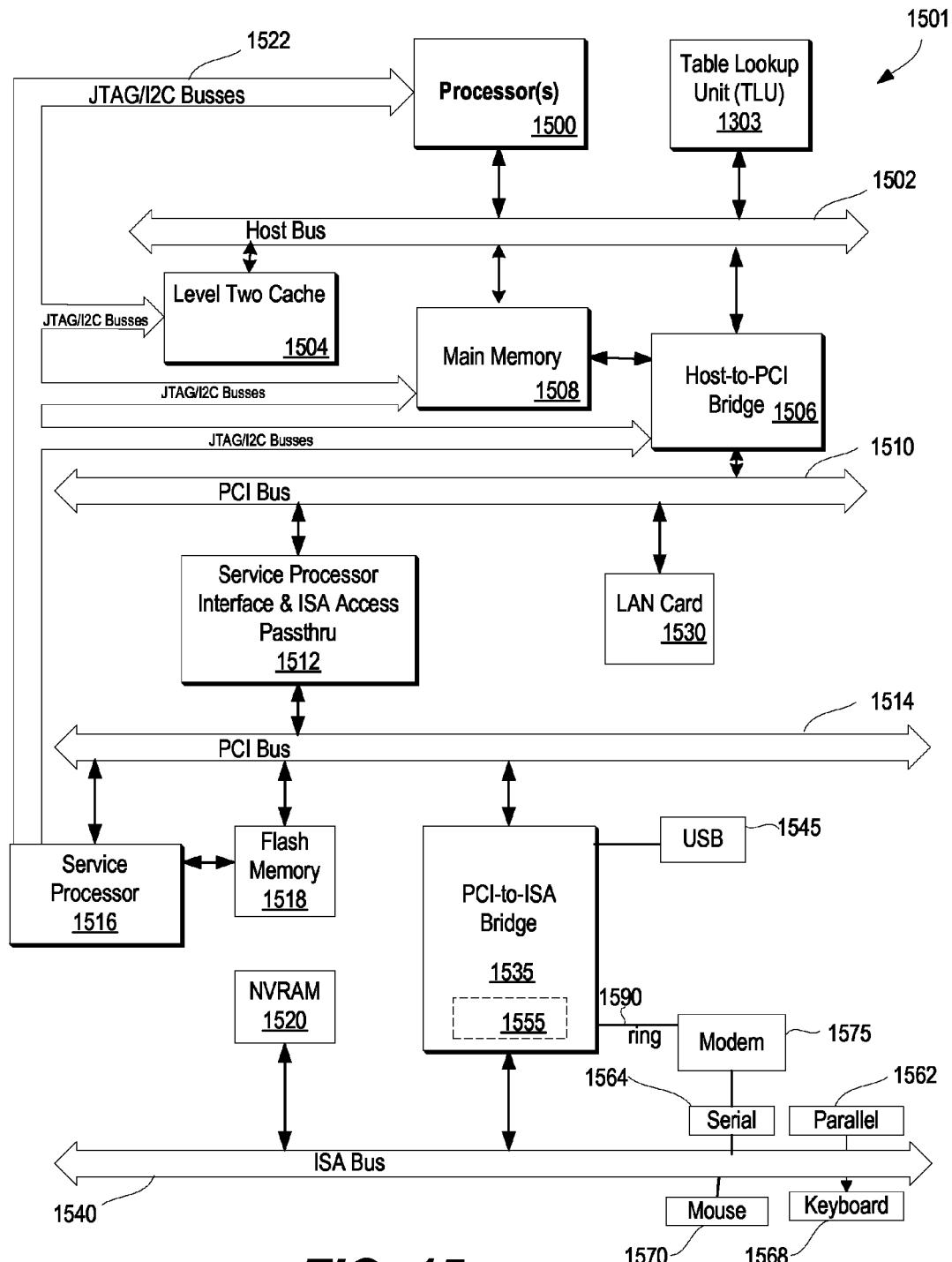
FIG. 15 is a block diagram illustrating a data processing system capable of executing the methods described herein.

FIG. 15 illustrates data processing system 1501 which is a simplified example of a computer system capable of performing the computing operations of the host computer described herein with respect to a preferred embodiment of the present invention. Computer system 1501 includes processor 1500 which is coupled to host bus 1502. A level two (L2) cache memory 1504 is also coupled to host bus 1502. Host-to-PCI bridge 1506 is coupled to main memory 1508, includes cache memory and main memory control functions, and provides bus control to handle transfers among PCI bus 1510, processor 1500, L2 cache 1504, main memory 1508, and host bus 1502. Main memory 1508 is coupled to Host-to-PCI bridge 1506 as well as host bus 1502. Devices used solely by host processor(s) 1500, such as LAN card 1530, are coupled to PCI bus 1510. Service Processor Interface and ISA Access Pass-through 1512 provide an interface between PCI bus 1510 and PCI bus 1514. In this manner, PCI bus 1514 is insulated from PCI bus 1510. Devices, such as flash memory 1518, are coupled to PCI bus 1514. In one implementation, flash memory 1518 includes BIOS code that incorporates the necessary processor executable code for a variety of low-level system functions and system boot functions.

PCI bus 1514 provides an interface for a variety of devices that are shared by host processor(s) 1500 and Service Processor 1516 including, for example, flash memory 1518. PCI-to-ISA bridge 1535 provides bus control to handle transfers between PCI bus 1514 and ISA bus 1540, universal serial bus (USB) functionality 1545, power management functionality 1555, and can include other functional elements not shown, such as a real-time clock (RTC), DMA control, interrupt support, and system management bus support. Nonvolatile RAM 1520 is attached to ISA Bus 1540. Service Processor 1516 includes JTAG and I2C buses 1522 for communication with processor(s) 1500 during initialization steps. JTAG/I2C buses 1522 are also coupled to L2 cache 1504, Host-to-PCI bridge 1506, and main memory 1508 providing a communications path between the processor, the Service Processor, the L2 cache, the Host-to-PCI bridge, and the main memory. Service Processor 1516 also has access to system power resources for powering down data processing device 1501.

Peripheral devices and input/output (I/O) devices can be attached to various interfaces (e.g., parallel interface 1562, serial interface 1564, keyboard interface 1568, and mouse interface 1570 coupled to ISA bus 1540. Alternatively, many I/O devices can be accommodated by a super I/O controller (not shown) attached to ISA bus 1540.

In order to attach computer system 1501 to another computer system to copy files over a network, LAN card 1530 is coupled to PCI bus 1510. Similarly, to connect computer system 1501 to an ISP to connect to the Internet using a telephone line connection, modem 1575 is connected to serial port 1564 and PCI-to-ISA Bridge 1535.

While the data processing system described in FIG. 15 is capable of executing the processes described herein, this data processing system is simply one example of a data processing system. Those skilled in the art will appreciate that many other data processing system designs are capable of performing the processes described herein.

One of the preferred implementations of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine. Functional descriptive material includes, but is not limited to, computer programs, instructions, rules, facts, definitions of computable functions, objects, and data structures.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an;" the same holds true for the use in the claims of definite articles.

What is claimed is:

1. A computer-implemented method of performing time-based symbolic simulation, the method comprising:

creating a delay-aware representation of a circuit, wherein the delay-aware representation includes a plurality of circuit nodes;

simulating a first plurality of transitions from a first set of circuit nodes selected from the plurality of circuit nodes to a second set of circuit nodes selected from the plurality of circuit nodes, the simulating based on executing a first set of simulation events;

generating a second set of simulation events in response to executing the first set of simulation events, wherein the second set of simulation events are generated based on the execution of the first set of simulation events;

simulating a second plurality of transitions from the second set of circuit nodes to a third set of circuit nodes selected from the plurality of circuit nodes, the simulating based on executing the second set of simulation events;

computing a plurality of times corresponding to the first and the second plurality of transitions; and constructing an event scheduling diagram that depicts the first and second plurality of transitions and the computed times corresponding to the first and second plurality of transitions.

2. The method of claim 1 further comprising:

storing the computed times in a data structure, wherein each of the computed times corresponds to one or more of the transitions, wherein at least one of the computed times corresponding to a selected one of the transitions is less than a maximum computed time corresponding to the selected transition;

retrieving a plurality of circuit nodes from the delay-aware representation, the circuit nodes being associated to one or more of the events, wherein each of the received circuit nodes transitions to a new state when the associated event occurs;

retrieving a direction corresponding to each of the transitions from the delay-aware representation;

generating a first Boolean expression associated to each transition, wherein the first Boolean expression represents the condition of the associated transition; and generating a second Boolean expression associated to each of one or more future events, wherein the second Boolean expression represents the condition when the future event is scheduled.

3. The method of claim 1 wherein the simulating further comprises:
computing two Boolean function sets corresponding one of the plurality of circuit nodes (a first node), wherein the first Boolean function set corresponds to the first node being pulled up, and the second Boolean function set corresponds to the first node being pulled down.

4. The method of claim 1 further comprising:
retrieving, from the delay-aware representation of the circuit, path data corresponding to a simulated conductive path connecting one of the first set of circuit nodes (a first node) to one of the second set of circuit nodes (a second node);
obtaining a path delay time corresponding to the conductive path, wherein the computing of the time of the transition from the first node to the second node includes the obtained path delay.

5. The method of claim 4 wherein the obtaining is performed by a process selected from the group consisting of:
calculating the path delay time based upon the retrieved path data; and
retrieving the path delay time corresponding to the simulated conductive path from a data store.

6. The method of claim 1 further comprising:
retrieving an analyzer, wherein the analyzer includes a type of timing analysis;
computing one or more end nodes for exploration of the event scheduling diagram based on the type of timing analysis; and
applying the retrieved analyzer to the event scheduling diagram.

7. The method of claim 6 further comprising:
traversing the event scheduling diagram backwards from an end node selected from the one or more end nodes to an initial node; and
generating concrete input vectors corresponding to one or more path-related timing questions.

8. The method of claim 6 further comprising:
during the simulating, comparing a predicate that corresponds to the analyzer with a plurality of states that each correspond to a state of the simulation;
stopping the simulating based on the comparison;
executing the analyzer against the event scheduling diagram that was constructed at the time of the stopped simulation; and
reporting a result of the executed analyzer.

9. The method of claim 6 wherein the applying of the analyzer further comprises:
computing one or more end nodes of the event scheduling diagram based on the type of timing analysis being performed;
traversing the event scheduling diagram backwards in order to find a path from each of the end nodes to an initial node of the event scheduling diagram; and
generating one or more concrete input vectors corresponding to path-related timing questions related to the type of timing analysis being performed.

10. The method of claim 6 further comprising:
after the applying of the retrieved analyzer to the event scheduling diagram, identifying at least one transition in the event scheduling diagram that cannot occur.

11. The method of claim 1 further comprising:
retrieving an analyzer to apply to the event scheduling diagram, wherein the analyzer includes a type of timing analysis; and
computing one or more end nodes for exploration of the event scheduling diagram based on the type of timing analysis.

12. The method of claim 1 further comprising:
repeatedly selecting an analyzer from a plurality of analyzers, wherein each of the analyzers includes a predicate and an analysis type;
comparing each of the analyzer predicates to a state of the simulation;
applying the selected analyzer to the event scheduling diagram in response to a selected analyzer's predicate being true, the applying including:
computing one or more end nodes for exploration of the event scheduling diagram based on the analysis type;
determining whether event scheduling diagram exploration is needed;
in response to event scheduling diagram exploration not being needed, executing the selected analysis to generate an analysis answer in response to event scheduling diagram; and
in response to event scheduling diagram exploration being needed:
traversing the event scheduling diagram backwards from an end node selected from the one or more end nodes to an initial node;
generating concrete input vectors corresponding to one or more path-related timing questions; and
computing the analysis answer using the generated concrete input vectors.

13. The method of claim 1 further comprising:
analyzing the constructed event scheduling diagram;
modifying the delay-aware representation of the circuit in response to the analysis; and
building a hardware circuit that corresponds to the modified delay-aware representation.

14. A data processing system comprising:
one or more processors;
a memory accessible by the processors;
a set of instructions stored in the memory, wherein one or more of the processors executes the set of instructions in order to perform actions of:
creating a delay-aware representation of a circuit, wherein the delay-aware representation includes a plurality of circuit nodes;
storing the delay-aware representation in the memory;
simulating a first plurality of transitions from a first set of circuit nodes selected from the plurality of circuit nodes to a second set of circuit nodes selected from the plurality of circuit nodes, the simulating based on executing a first set of simulation events;
generating a second set of simulation events in response to executing the first set of simulation events, wherein the second set of simulation events are generated based on the execution of the first set of simulation events;
simulating a second plurality of transitions from the second set of circuit nodes to a third set of circuit nodes selected from the plurality of circuit nodes, the simulating based on executing the second set of simulation events;
computing a plurality of times corresponding to the first and the second plurality of transitions; and
constructing an event scheduling diagram that depicts the first and second plurality of transitions and the computed times corresponding to the first and second plurality of transitions.

15. The data processing system of claim 14 wherein the set of instructions, when executed by the one or more processors, perform further actions comprising:
- storing the computed times in a data structure, wherein each of the computed times corresponds to one or more of the transitions;
- retrieving a plurality of circuit nodes from the delay-aware representation, the circuit nodes being associated to one or more of the events, wherein each of the received circuit nodes transitions to a new state when the associated event occurs;
- retrieving, from the delay-aware representation of the circuit, conductive path data corresponding to a simulated conductive path connecting one of the first set of circuit nodes (a first node) to one of the second set of circuit nodes (a second node);
- obtaining a path delay time corresponding to the simulated conductive path, wherein the computing of the time of the transition from the first node to the second node includes the obtained conductive path delay; and
- retrieving a direction corresponding to each of the transitions from the delay-aware representation.

16. The data processing system of claim 14 wherein the set of instructions, when executed by the one or more processors, perform further actions comprising:
- repeatedly selecting an analyzer from a plurality of analyzers, wherein each of the analyzers includes a predicate and an analysis type;
- comparing each of the analyzer predicates to a state of the simulation;
- applying the selected analyzer to the event scheduling diagram in response to a selected analyzer's predicate being true, the applying including:
  - computing one or more end nodes for exploration of the event scheduling diagram based on the analysis type;
  - determining whether event scheduling diagram exploration is needed;
  - in response to event scheduling diagram exploration not being needed, executing the selected analysis to generate an analysis answer in response to event scheduling diagram; and
  - in response to event scheduling diagram exploration being needed:
    - traversing the event scheduling diagram backwards from an end node selected from the one or more end nodes to an initial node;
    - generating concrete input vectors corresponding to one or more path-related timing questions; and
    - computing the analysis answer using the generated concrete input vectors.

17. A computer program product stored in a non-transitory computer readable medium, comprising functional descriptive material that, when executed by a data processing system, causes the data processing system to perform actions that include:
- creating a delay-aware representation of a circuit, wherein the delay-aware representation includes a plurality of circuit nodes;
- simulating a first plurality of transitions from a first set of circuit nodes selected from the plurality of circuit nodes to a second set of circuit nodes selected from the plurality of circuit nodes, the simulating based on executing a first set of simulation events;
- generating a second set of simulation events in response to executing the first set of simulation events, wherein the second set of simulation events are generated based on the execution of the first set of simulation events;
- simulating a second plurality of transitions from the second set of circuit nodes to a third set of circuit nodes selected from the plurality of circuit nodes, the simulating based on executing the second set of simulation events;
- computing a plurality of times corresponding to the first and the second plurality of transitions; and
- constructing an event scheduling diagram that depicts the first and second plurality of transitions and the computed times corresponding to the first and second plurality of transitions.

18. The computer program product of claim 17 wherein the functional descriptive material, when executed by the data processing system, causes the data processing system to perform further actions comprising:
- storing the computed times in a data structure, wherein each of the computed times corresponds to one or more of the transitions;
- retrieving a plurality of circuit nodes from the delay-aware representation, the circuit nodes being associated to one or more of the events, wherein each of the received circuit nodes transitions to a new state when the associated event occurs;
- retrieving, from the delay-aware representation of the circuit, conductive path data corresponding to a simulated conductive path connecting one of the first set of circuit nodes (a first node) to one of the second set of circuit nodes (a second node);
- obtaining a conductive path delay time corresponding to the simulated conductive path, wherein the computing of the time of the transition from the first node to the second node includes the obtained conductive path delay; and
- retrieving a direction corresponding to each of the transitions from the delay-aware representation.

19. The computer program product of claim 17 wherein the functional descriptive material, when executed by the data processing system, causes the data processing system to perform further actions comprising:
- retrieving an analyzer to apply to the event scheduling diagram, wherein the analyzer includes a type of timing analysis;
- computing one or more end nodes for exploration of the event scheduling diagram based on the type of timing analysis;
- analyzing the event scheduling diagram by executing the retrieved analyzer; and
- based on the executed analyzer, identifying at least one transition in the event scheduling diagram that cannot occur.

20. The computer program product of claim 17 wherein the functional descriptive material, when executed by the data processing system, causes the data processing system to perform further actions comprising:
- repeatedly selecting an analyzer from a plurality of analyzers, wherein each of the analyzers includes a predicate and an analysis type;
- comparing each of the analyzer predicates to a state of the simulation;
- applying the selected analyzer to the event scheduling diagram in response to a selected analyzer's predicate being true, the applying including:
  - computing one or more end nodes for exploration of the event scheduling diagram based on the analysis type;
  - determining whether event scheduling diagram exploration is needed;

in response to event scheduling diagram exploration not being needed, executing the selected analysis to generate an analysis answer in response to event scheduling diagram; and in response to event scheduling diagram exploration being needed:
  traversing the event scheduling diagram backwards from an end node selected from the one or more end nodes to an initial node;
  generating concrete input vectors corresponding to one or more path-related timing questions; and
  computing the analysis answer using the generated concrete input vectors.

* * * * *